United States Patent
Choi

(10) Patent No.: US 11,888,038 B2
(45) Date of Patent: Jan. 30, 2024

(54) INTEGRATED CIRCUIT DEVICES AND METHODS OF MANUFACTURING THE SAME

(71) Applicant: Samsung Electronics Co., Ltd., Suwon-si (KR)

(72) Inventor: Joonyoung Choi, Suwon-si (KR)

(73) Assignee: Samsung Electronics Co., Ltd.

( * ) Notice: Subject to any disclaimer, the term of this patent is extended or adjusted under 35 U.S.C. 154(b) by 121 days.

(21) Appl. No.: 17/488,825

(22) Filed: Sep. 29, 2021

(65) Prior Publication Data
US 2022/0115504 A1    Apr. 14, 2022

(30) Foreign Application Priority Data
Oct. 8, 2020  (KR) .......................... 10-2020-0130442

(51) Int. Cl.
*H01L 29/40*    (2006.01)
(52) U.S. Cl.
CPC .................................. *H01L 29/408* (2013.01)
(58) Field of Classification Search
CPC ........................... H10B 12/482; H10B 12/315; H10B 12/0335; H10B 12/485
See application file for complete search history.

(56) References Cited

U.S. PATENT DOCUMENTS

| | | | |
|---|---|---|---|
| 4,081,292 A | 3/1978 | Aoki et al. | |
| 4,242,697 A | 12/1980 | Berthold et al. | |
| 6,346,444 B1 | 2/2002 | Park et al. | |
| 8,884,342 B2 | 11/2014 | Schmidt et al. | |
| 9,601,690 B1 | 3/2017 | Gee et al. | |
| 2018/0342520 A1* | 11/2018 | Chun | ............... H01L 21/76877 |

FOREIGN PATENT DOCUMENTS

| | | |
|---|---|---|
| CN | 105244326 A | 1/2016 |
| CN | 106783608 A | 5/2017 |
| CN | 107437566 A | 12/2017 |

OTHER PUBLICATIONS

Hamasaki et al. "Electronic Properties of Semi-Insulating Polycrystallinesilicon (SIPOS) Doped With Oxygen Atoms" Solid State Communications 21:591-593 (1977).
Mochizuki et al. "Semi-Insulating Polycrystalline-Silicon (SIPOS) Films Applied to MOS Integrated Circuits" Japanese Journal of Applied Physics 15:41-48 (1976).
Zhang, Xi "Oxygen-insertion Technology for CMOS Performance Enhancement" UC Berkeley Electronic Theses and Dissertations (112 pages) (2019).

* cited by examiner

*Primary Examiner* — Raj R Gupta
(74) *Attorney, Agent, or Firm* — Myers Bigel, P.A.

(57) ABSTRACT

An integrated circuit device includes a substrate having an active area therein, a bit line on the substrate, and a direct contact, which extends between the active area and the bit line and electrically couples the bit line to a portion of the active area. A spacer structure is also provided, which extends on sidewalls of the bit line and on sidewalls of the direct contact. A field passivation layer is provided, which extends between the sidewalls of the direct contact and the spacer structure. The spacer structure and the field passivation layer may include different materials, and the field passivation layer may directly contact the sidewalls of the direct contact. The field passivation layer can include non-stoichiometric silicon oxide $SiO_x$, where $0.04 \leq x \leq 0.4$, and may have a thickness of less than about 25 Å.

19 Claims, 23 Drawing Sheets

INTEGRATED CIRCUIT DEVICES AND METHODS OF MANUFACTURING THE SAME

REFERENCE TO PRIORITY APPLICATION

This application claims priority under 35 U.S.C. § 119 to Korean Patent Application No. 10-2020-0130442, filed Oct. 8, 2020, the disclosure of which is hereby incorporated herein by reference.

BACKGROUND

The inventive concept relates to integrated circuit devices and methods of manufacturing the same, and more particularly, to integrated circuit devices having interconnect structures and lines therein, and methods of manufacturing the integrated circuit devices.

As integrated circuit devices are downscaled, the sizes of individual fine circuit patterns for implementing integrated circuit devices is reduced. Also, as integrated circuit devices become more highly integrated, the size of electrical contacts is also reduced, and this reduction can lead to increases in contact resistance. Such increases in contact resistance can lead to impaired electrical performance and reduced reliability.

SUMMARY

The inventive concept provides integrated circuit devices with reduced contact resistances, notwithstanding smaller contact dimensions, etc., and improved electrical performance of integrated circuit devices that results therefrom. The inventive concept also provides methods of manufacturing integrated circuit devices with improved performance resulting from electrical contacts having reduced dimensions and reduced contact resistance.

According to an aspect of the inventive concept, there is provided an integrated circuit device with a substrate having an active area therein, a bit line extending on the substrate in a first direction parallel to a top surface of the substrate and including a lower conductive pattern and an upper conductive pattern, a direct contact disposed between the active area of the substrate and the bit line, a spacer structure disposed on both sidewalls of the bit line to cover both sidewalls of the direct contact, and a field passivation layer disposed between the both sidewalls of the direct contact and the spacer structure.

According to another aspect of the inventive concept, there is provided an integrated circuit device having a substrate and an active area within the substrate. A bit line is provided, which extends on the substrate in a first direction parallel to a top surface of the substrate. The bit line includes a lower conductive pattern and an upper conductive pattern. A direct contact is provided between the active area of the substrate and the bit line. A field passivation layer is provided, which is disposed on both sidewalls of the direct contact (to contact a whole sidewall of the direct contact). A spacer structure is provided, which is disposed on both sidewalls of the bit line. The spacer structure extends to both sidewalls of the direct contact and contacts the field passivation layer.

According to another aspect of the inventive concept, there is provided an integrated circuit device, which includes a substrate having an active area therein. A bit line is provided, which extends on the substrate (in a first direction parallel to a top surface of the substrate). The bit line includes a lower conductive pattern and an upper conductive pattern. A plurality of gate electrodes are provided, which are respectively disposed in a plurality of trenches extending in a second direction in the substrate. A direct contact is provided, which is disposed between the active area of the substrate and the bit line. A field passivation layer is provided, which is disposed on both sidewalls of the direct contact. A spacer structure is provided, which is disposed on both sidewalls of the bit line. The spacer structure includes a first spacer layer disposed on both sidewalls of the bit line, a second spacer disposed on the both sidewalls of the bit line to cover the first spacer layer, and a spacer structure including an air space disposed between the first spacer layer and the second spacer layer. Advantageously, the field passivation layer is disposed between the direct contact and the first spacer layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings.

Figure 1:
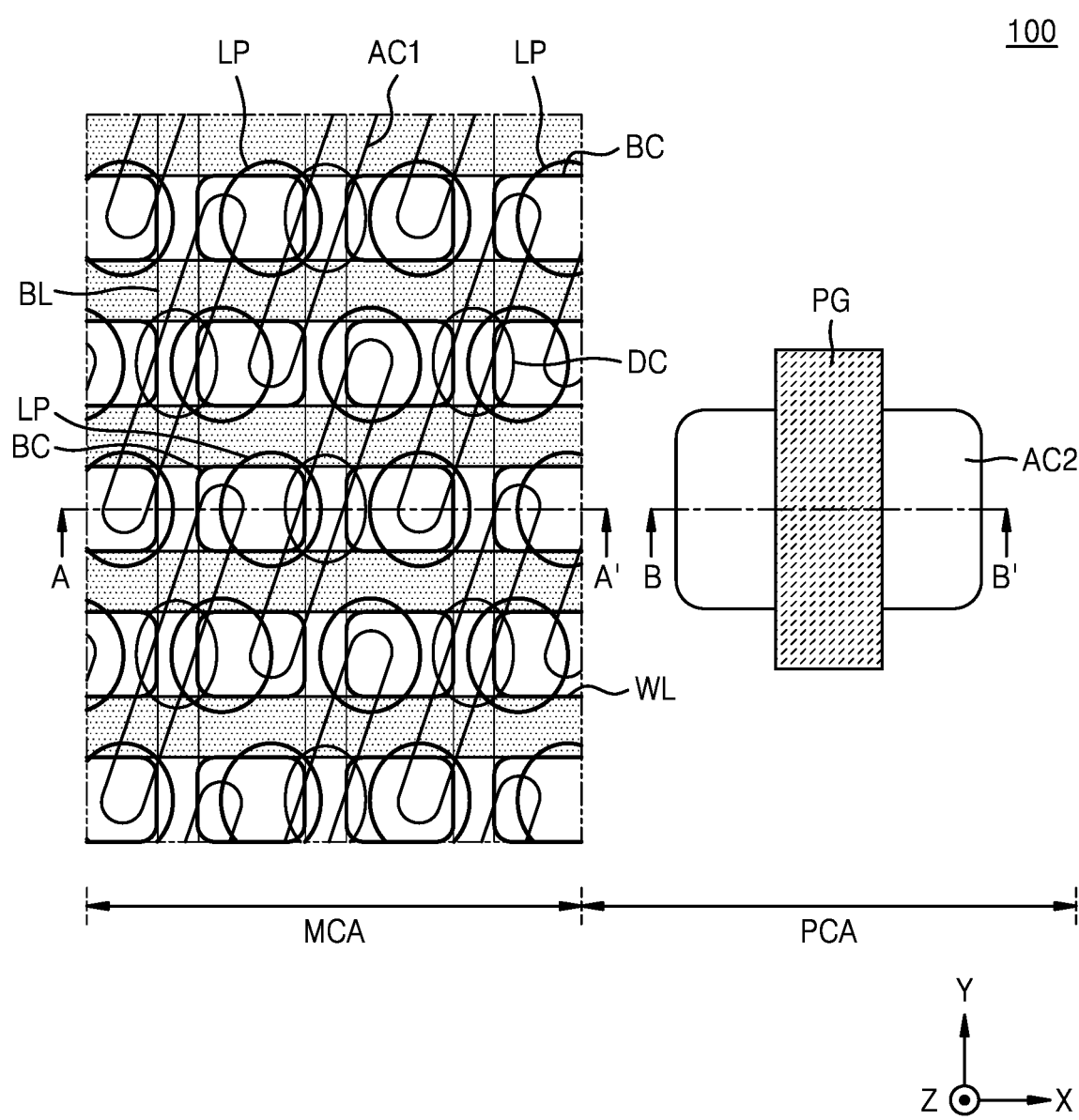
FIG. 1 is a layout diagram illustrating an integrated circuit device according to an embodiment of the invention.
Figure 2:
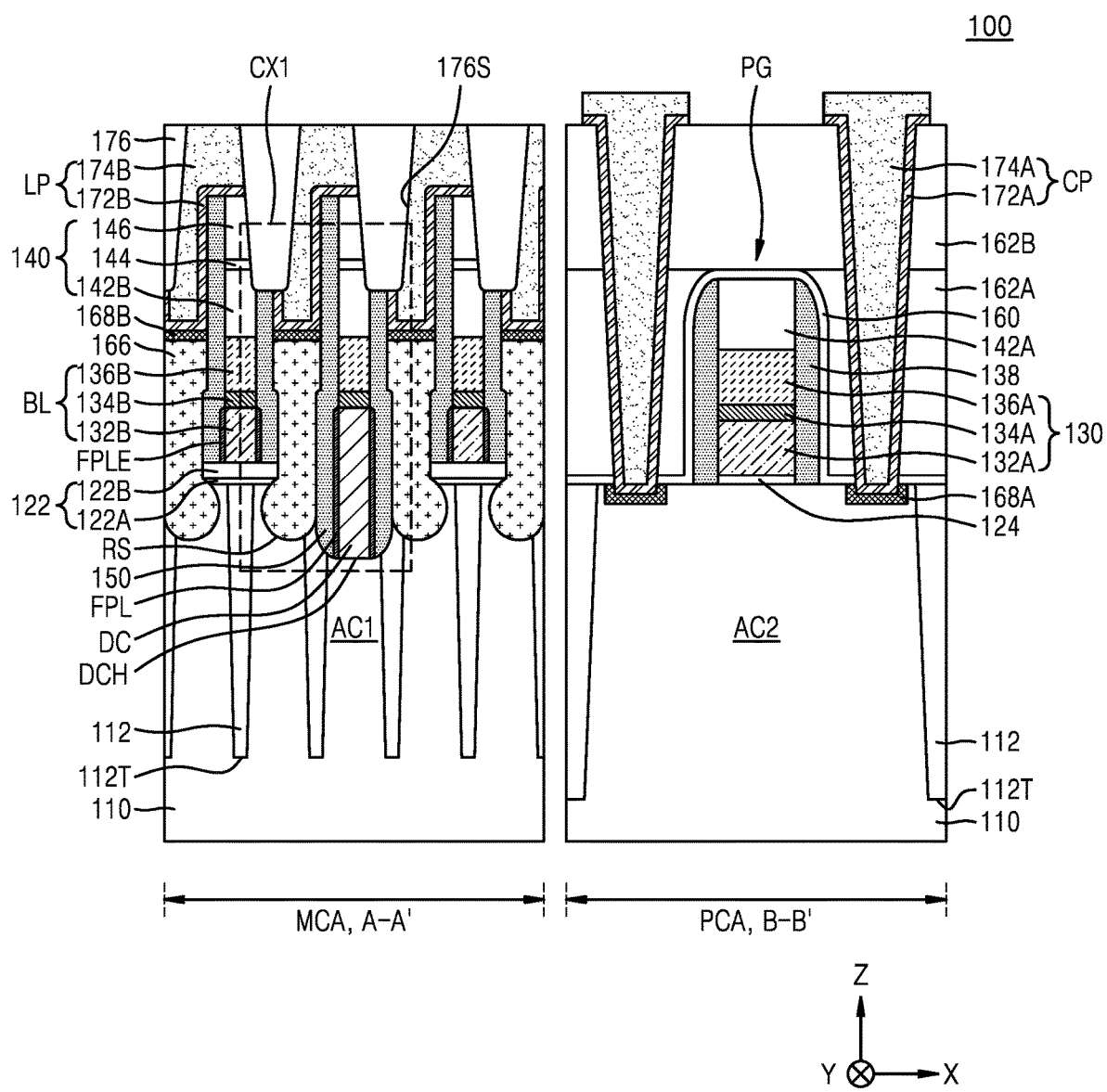
FIG. 2 is a cross-sectional view taken along lines A-A' and B-B' of FIG. 1.
Figure 3:
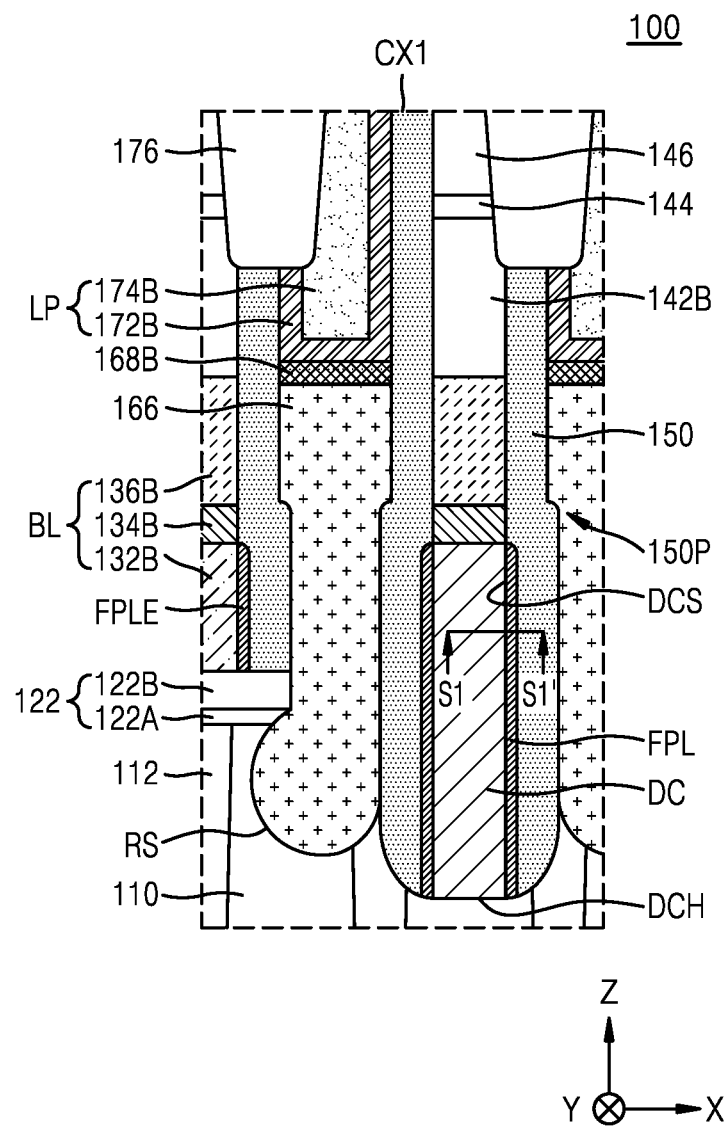
FIG. 3 is an enlarged view of a region CX1 of FIG. 2.

FIG. 1 is a layout diagram illustrating an integrated circuit device 100 according to an embodiment. FIG. 2 is a cross-sectional view taken along lines A-A' and B-B' of FIG. 1, and FIG. 3 is an enlarged view of a highlighted region CX1 of FIG. 2. Referring to FIGS. 1 to 3, the integrated circuit device 100 may include a substrate 110, which includes a cell array area MCA and a peripheral circuit area PCA therein. An isolation trench 112T may be formed in the substrate 110, and an electrically insulating isolation layer 112 may be formed in the isolation trench 112T. Based on the isolation layer 112, a plurality of first active areas AC1 may be defined in the substrate 110 in the cell array area MCA, and at least one second active area AC2 may be defined in the substrate 110 in the peripheral circuit area PCA.

Each of the plurality of first active areas AC1 may be disposed to cross a long axis in a diagonal direction with respect to an X direction and a Y direction. A plurality of word lines WL may extend in parallel in the X direction across the plurality of first active areas AC1. A plurality of bit lines BL may extend in parallel in the Y direction, on the plurality of word lines WL. The plurality of bit lines BL may be respectively connected to the plurality of first active areas AC1 through a direct contact DC.

A plurality of buried contacts BC may be formed between two adjacent bit lines BL of the plurality of bit lines BL. The plurality of buried contacts BC may be arranged in one row in the X direction and the Y direction. And, a plurality of landing pads LP may be formed on the plurality of buried contacts BC. The plurality of buried contacts BC and the plurality of landing pads LP may electrically connect the first active area AC1 to a lower electrode (not shown) of a capacitor formed on the plurality of bit lines BL. Each of the plurality of landing pads LP may be disposed to partially overlap a corresponding buried contact BC of the plurality of buried contacts BC.

The substrate 110 may include a semiconductor material, such as single crystalline silicon, polycrystalline silicon, or amorphous silicon. In some other embodiments, the substrate 110 may include at least one material selected from among germanium (Ge), silicon germanium (SiGe), silicon carbide (SiC), gallium arsenide (GaAs), indium arsenide (InAs), and indium phosphide (InP). In some embodiments, the substrate 110 may include a conductive area (for example, an impurity-doped well or an impurity-doped structure). The isolation layer 112 may include an electrically insulating material, such as an oxide, nitride, or a combination thereof.

In the cell array area MCA, a plurality of word line trenches (not shown) extending in a first direction (the X direction) may be formed in the substrate 110, and a plurality of gate dielectric layers (not shown), a plurality of gate electrodes (not shown), and a plurality of capping insulation layers (not shown) may be formed in the plurality of word line trenches. The plurality of gate electrodes may correspond to a plurality of word lines WL illustrated in FIG. 1. The plurality of gate dielectric layers may each include silicon oxide, silicon nitride, silicon oxynitride, an oxide/nitride/oxide (ONO) film, or a high-k dielectric film having a dielectric constant which is higher than that of silicon oxide. The plurality of gate electrodes may each include titanium (Ti), titanium nitride (TiN), tantalum (Ta), tantalum nitride (TaN), tungsten (W), tungsten nitride (WN), titanium silicon nitride (TiSiN), tungsten silicon nitride (WSiN), or a combination thereof. The plurality of capping insulation layers may each include silicon oxide, silicon nitride, silicon oxynitride, or a combination thereof.

A buffer layer 122 may be formed on the substrate 110 in the cell array area MCA. The buffer layer 122 may include a first insulation layer 122A and a second insulation layer 122B. Each of the first insulation layer 122A and the second insulation layer 122B may include oxide, nitride, or a combination thereof.

A plurality of direct contacts DC may be respectively formed in a plurality of direct contact holes DCH in the substrate 110. The plurality of direct contacts DC may be respectively connected to the plurality of first active areas AC1. The plurality of direct contacts DC may include doped polysilicon. For example, the plurality of direct contacts DC may include polysilicon, including n-type impurities at a relatively high concentration, such as phosphorous (P), arsenic (As), bismuth (Bi), and antimony (Sb).

The plurality of bit lines BL may extend in a second direction (the Y direction) on the substrate 110 and on the plurality of direct contacts DC. Each of the plurality of bit lines BL may be connected to the first active area AC1 through a corresponding direct contact DC. Each of the plurality of bit lines BL may include a lower conductive pattern 132B, a middle conductive pattern 134B, and an upper conductive pattern 136B, which are sequentially stacked on the substrate 110. The lower conductive pattern 132B may include doped polysilicon. Each of the middle conductive pattern 134B and the upper conductive pattern 136B may include TiN, TiSiN, tungsten (W), tungsten silicide, or a combination thereof. In embodiments, the middle conductive pattern 134B may include TiN, TiSiN, or a combination thereof, and the upper conductive pattern 136B may include tungsten (W).

The plurality of bit lines BL may be respectively covered by a plurality of insulation capping structures 140. Each of the plurality of insulation capping structures 140 may include a lower capping pattern 142B, an insulation layer pattern 144, and an upper capping pattern 146. The lower capping pattern 142B, the insulation layer pattern 144, and the upper capping pattern 146 may include silicon nitride. The plurality of insulation capping structures 140 may extend in the Y direction, on the plurality of bit lines BL.

A spacer structure 150 may be disposed on both sidewalls of each of the plurality of bit lines BL. The spacer structure 150 may include silicon nitride. The spacer structure 150 may extend in the Y direction, on the both sidewalls of each of the plurality of bit lines BL. And, a portion of the spacer structure 150 may extend to an inner portion of the direct contact hole DCH and may cover both sidewalls of the direct contact DC.

The direct contact DC may be formed in the direct contact hole DCH formed in the substrate 110 and may extend up to a level which is higher than a top surface of the substrate 110. For example, a top surface of the direct contact DC may be at the same level as a top surface of the lower conductive pattern 132B, and the top surface of the direct contact DC may contact a bottom surface of the middle conductive pattern 134B. For example, the top surface of the direct contact DC may be coplanar with the top surface of the lower conductive pattern 132B. Also, the bottom surface of the direct contact DC may be at a level which is lower than the top surface of the substrate 110.

A field passivation layer FPL may be disposed on both sidewalls DCS, disposed apart from each other in the X direction, of the direct contact DC. Advantageously, the field passivation layer FPL may prevent an electric charge from being trapped by an interface between the spacer structure 150 and the direct contact DC, or may perform a function of screening a field caused by a bulk charge of the spacer structure 150.

In embodiments, the field passivation layer FPL may include a semi-insulating material. For example, the field passivation layer FPL may include nonstoichiometric silicon oxide. For example, in one embodiment, the FPL may include $SiO_x$ ($0.04 \leq x \leq 0.4$). Preferably, the field passivation layer FPL may have bandgap energy which is greater than bandgap energy of silicon included in the direct contact DC, such as a bandgap energy of about 1.28 eV to about 1.7 eV. The field passivation layer FPL may have a first thickness t11 of about 25 Å or less in the X direction.

In other embodiments, the field passivation layer FPL may include first impurities, including at least one of phosphorus (P), arsenic (As), bismuth (Bi), and antimony (Sb), at a first concentration, which may be within a range from about $1\times10^{16}$ cm$^{-3}$ to about $1\times10^{21}$ cm$^{-3}$. The first impurities may be in-situ doped in an epitaxy forming process of the field passivation layer FPL. Bandgap energy of the field passivation layer FPL may be adjusted based on the first concentration of the first impurities.

In embodiments, the field passivation layer FPL may be disposed to cover all of the both sidewalls DCS of the direct contact DC and may be directly disposed on the direct contact DC. Thus, an additional material layer need not be disposed between the field passivation layer FPL and the direct contact DC.

In some embodiments, a top surface of the field passivation layer FPL may be at the same level as the top surface of the direct contact DC, and a bottom surface of the field passivation layer FPL may extend to an inner portion of the direct contact hole DCH and may be at the same level as a bottom surface of the direct contact DC. All of a sidewall DCS of the direct contact may contact the field passivation layer FPL. Thus, the sidewall DCS of the direct contact DC may not directly contact the spacer structure 150.

In some embodiments, the field passivation layer FPL may extend to a sidewall of the lower conductive pattern 132B of the bit line BL. For example, a portion of the field passivation layer FPL disposed on a sidewall of the lower conductive pattern 132B may be referred to as an extension portion FPLE. The extension portion FPLE of the field passivation layer FPL may cover a whole area of both sidewalls, which are apart from each other in the X direction, of the lower conductive pattern 132B, and may extend in the Y direction on the sidewall of the lower conductive pattern 132B.

The extension portion FPLE may include a top surface which is at the same level as the top surface of the lower conductive pattern 132B, and a bottom surface of the extension portion FPLE may contact the buffer layer 122. The sidewall of the lower conductive pattern 132B may be covered by the extension portion FPLE; therefore, the sidewall of the lower conductive pattern 132B may not directly contact the spacer structure 150. The field passivation layer FPL (or the extension portion FPLE) may not be disposed between the upper conductive pattern 136B and the spacer structure 150; therefore, the field passivation layer FPL (or the extension portion FPLE) may not directly contact the upper conductive pattern 136B.

A plurality of conductive plugs 166 and a plurality of insulation fences (not shown) may be alternately disposed in one row in the Y direction between two adjacent bit lines of the plurality of bit lines BL. The plurality of conductive plugs 166 may extend long in a vertical direction (a Z direction) from a recessed space RS formed in the substrate 110. The plurality of insulation fences may be disposed on the capping insulation layer disposed on the plurality of word line trenches and may each be disposed between two adjacent conductive plugs 166 of the plurality of conductive plugs 166. Both sidewalls of the plurality of conductive plugs 166 may be isolated from each other by the plurality of insulation fences in the Y direction. The plurality of insulation fences may include silicon oxide. The plurality of conductive plugs 166 may be configured as the plurality of buried contacts BC illustrated in FIG. 1.

In some embodiments, and as illustrated in FIG. 3, because the field passivation layer FPL is formed on the sidewall DCS of the direct contact DC, and because it is not disposed on the upper conductive pattern 136B and the sidewall of the insulation capping structure 140, the field passivation layer FPL may protrude outward with respect to the upper conductive pattern 136B. Therefore, the spacer structure 150 may include a protrusion portion 150P, at a portion thereof corresponding to the top surface of the field passivation layer FPL. Also, a top surface of each of the plurality of conductive plugs 166 may be at a level which is higher than the top surface of the field passivation layer FPL (or the protrusion portion 150P). Thus, an upper width of each of the plurality of conductive plugs 166 may be set to be greater than a center width thereof (for example, a width of a portion between the lower conductive pattern 132B and the direct contact DC).

A plurality of metal silicide layers 168B and the plurality of landing pads LP may be formed on the plurality of conductive plugs 166. The metal silicide layer 168B and the landing pad LP may be disposed to vertically overlap the conductive plug 166. The metal silicide layer 168B may include cobalt silicide, nickel silicide, or manganese silicide. Each of the plurality of landing pads LP may be connected to the conductive plug 166 through the metal silicide layer 168B.

The plurality of landing pads LP may cover at least a portion of a top surface of the upper capping pattern 146 to vertically overlap a part of the plurality of bit lines BL. Each of the plurality of landing pads LP may include a conductive barrier layer 172B and a landing pad conductive layer 174B. The conductive barrier layer 172B may include Ti, TiN, or a combination thereof. The landing pad conductive layer 174B may include a metal, a metal nitride, polysilicon doped with impurities, or a combination thereof. For example, the landing pad conductive layer 174B may include tungsten (W). As seen in a plane, the plurality of landing pads LP may have a shape corresponding to a plurality of island patterns.

The plurality of landing pads LP may be electrically insulated from one another by an insulation pattern 176 filled in an insulation space 176S around the plurality of landing pads LP. The insulation pattern 176 may be filled into a lower portion of the insulation space 176S disposed between the bit line BL and the conductive plug 166 and may cover both sidewalls of the bit line BL. Thus, the insulation pattern 176 may cover both sidewalls of the lower conductive pattern 132B, the middle conductive pattern 134B, and the upper conductive pattern 136B.

In some embodiments, the insulation pattern 176 may include silicon nitride, silicon oxynitride, silicon oxide, or a combination thereof. In addition, the insulation pattern 176 may have a double-layer structure of a first material layer and a second material layer, the first material layer may include a low-k material such as $SiO_2$, SiOCH, or SiOC, and the second material layer may include silicon nitride or silicon oxynitride.

A gate structure PG may be formed on the second active area AC2 in the peripheral circuit area PCA. The gate structure PG may include a gate dielectric layer 124, a gate electrode 130, and a gate capping pattern 142A, which are sequentially stacked on the second active area AC2.

The gate dielectric layer 124 may include at least one selected from a group consisting of: silicon oxide, silicon nitride, silicon oxynitride, ONO, or a high-k dielectric film having a dielectric constant which is higher than that of silicon oxide. The gate electrode 130 may include a lower conductive pattern 132A, a middle conductive pattern 134A, and an upper conductive pattern 136A. A material of each of the lower conductive pattern 132A, the middle conductive pattern 134A, and the upper conductive pattern 136A may be the same as materials of the lower conductive pattern 132B, the middle conductive pattern 134B, and the upper conductive pattern 136B, which are included in the bit line BL in the cell array area MCA. The gate capping pattern 136A may include silicon nitride.

In some embodiments, both sidewalls of the gate structure PG may be covered by the insulation spacer 138. The insulation spacer 138 may include an oxide, a nitride, or a combination thereof. The gate structure PG and the insulation spacer 138 may be covered by a passivation layer 160. The passivation layer 160 may include silicon nitride. An interlayer insulation layer 162A may be formed around the gate structure PG, on the passivation layer 160. The interlayer insulation layer 162A may include Tonen SilaZene (TOSZ), but is not limited thereto. The gate structure PG, the passivation layer 160, and the interlayer insulation layer 162A may be covered by an upper insulation capping layer 162B. The upper insulation capping layer 162B may include silicon nitride.

A contact plug CP, vertically passing through the upper insulation capping layer 162B, the interlayer insulation layer 162A, and the passivation layer 160 and extending to the second active area AC2 of the substrate 110, may be formed in the peripheral circuit area PCA. The contact plug CP may include a conductive barrier layer 172A and a landing pad conductive layer 174A, which is similar to the plurality of landing pads LP formed in the cell array area MCA. A metal silicide layer 168A may be disposed between the second active area AC2 and the contact plug CP. The metal silicide layer 168A may include cobalt silicide, nickel silicide, or manganese silicide.

Figure 4A:
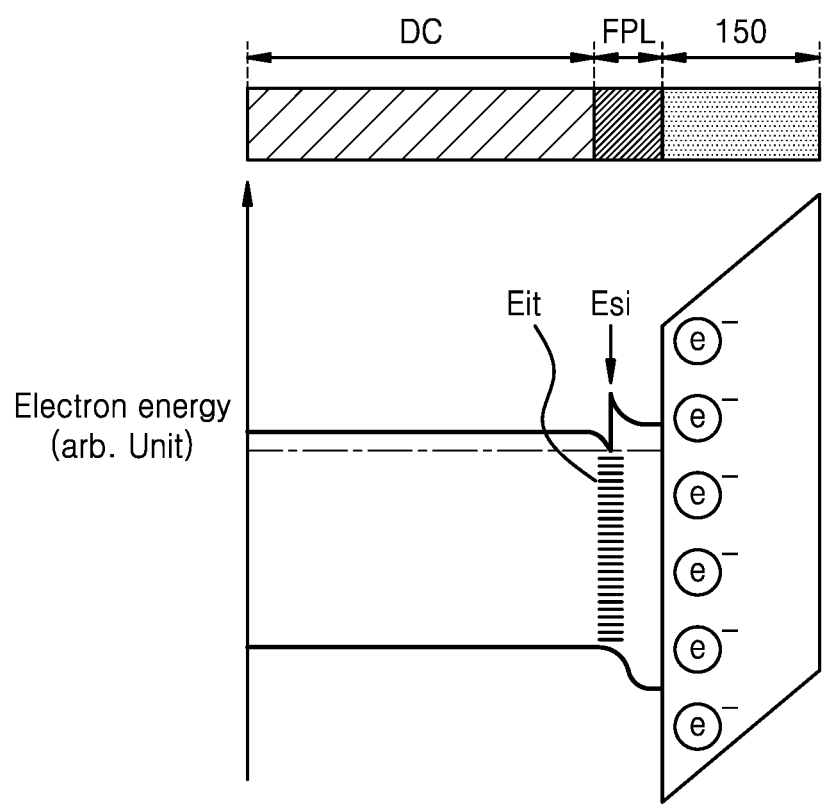
FIG. 4A is a schematic energy band diagram in a region S1-S1' of FIG. 3.

Hereinafter, a charge passivation characteristic of the field passivation layer FPL will be described with reference to FIGS. 4A to 4C. FIG. 4A is a schematic energy band diagram in a region S1-S1' of FIG. 3. Referring to FIG. 4A, a schematic electron energy level in a structure where a direct contact DC including polysilicon, a spacer structure 150 including silicon nitride, and nonstoichiometric $SiO_x$ (0.04≤x≤0.4) disposed therebetween is illustrated. The field passivation layer FPL may have bandgap energy of about 1.28 eV to about 1.7 eV, and the bandgap energy may be greater than bandgap energy of about 1.1 eV, which is bandgap energy of the polysilicon material included in the direct contact DC. Based on this bandgap energy different, an interface trap charge Eit having a reduced number may be formed in a hetero-interface Esi between the field passivation layer FPL and the direct contact DC. A number of electrons may be generated based on electron inversion at the hetero-interface Esi between the field passivation layer FPL and the direct contact DC. Accordingly, the field passivation layer FPL may function as a charge passivation layer which blocks a field caused by a bulk charge of the spacer structure 150 (for example, by a number of electrons formed in the hetero-interface Esi).

Additionally, a quantum well in the field passivation layer FPL may be formed by band offset at the hetero-interface Esi between the field passivation layer FPL and the direct contact DC, thereby increasing a charge density.

Generally, a number of interface trap charges may be formed at an interface between polysilicon and silicon nitride and a negative trap charge (a bulk trap charge) may be formed in silicon nitride. In response, a depletion region may be formed near a polysilicon surface by an interface trap charge and a bulk trap charge to have a relatively large thickness. The formed depletion region may increase a resistance of polysilicon.

However, according to the embodiments described above, because the field passivation layer FPL including nonstoichiometric $SiO_x$ (0.04≤x≤0.4) is formed between the direct contact DC and the spacer structure 150, a charge trap density at an interface between the direct contact DC and the spacer structure 150 may be reduced. Therefore, advantageously, any depletion occurring in the direct contact DC due to a bulk trap charge of the spacer structure 150 may be reduced or prevented. Also, a charge density of the direct contact DC may be enhanced by the quantum well formed in the field passivation layer FPL; therefore, the direct contact DC may have a relatively low resistance.

Figure 4B:
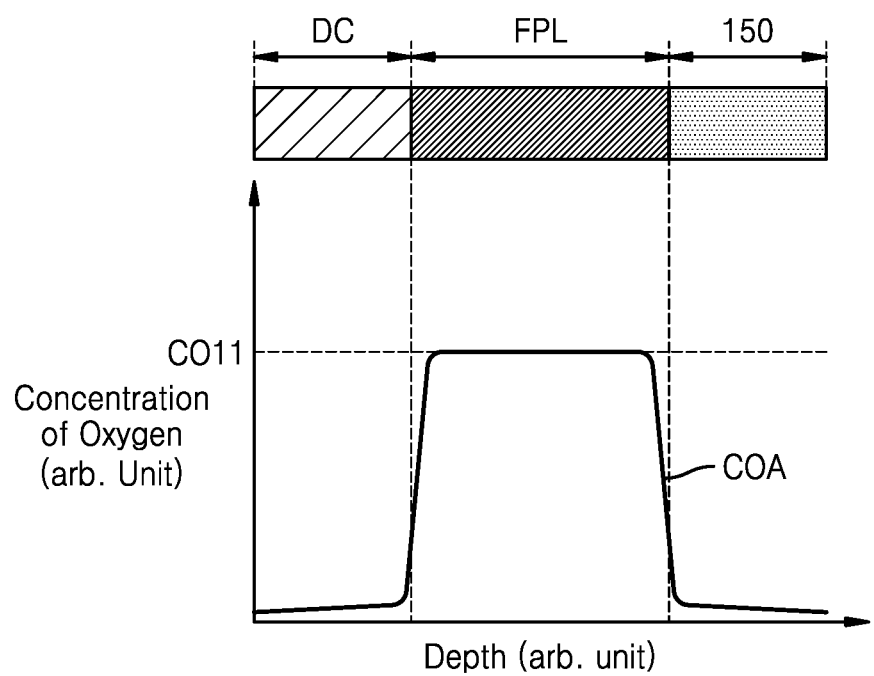
FIGS. 4B and 4C are schematic diagrams illustrating a content profile of nonstoichiometric silicon oxide ($SiO_x$) included in a field passivation layer.
Figure 4C:
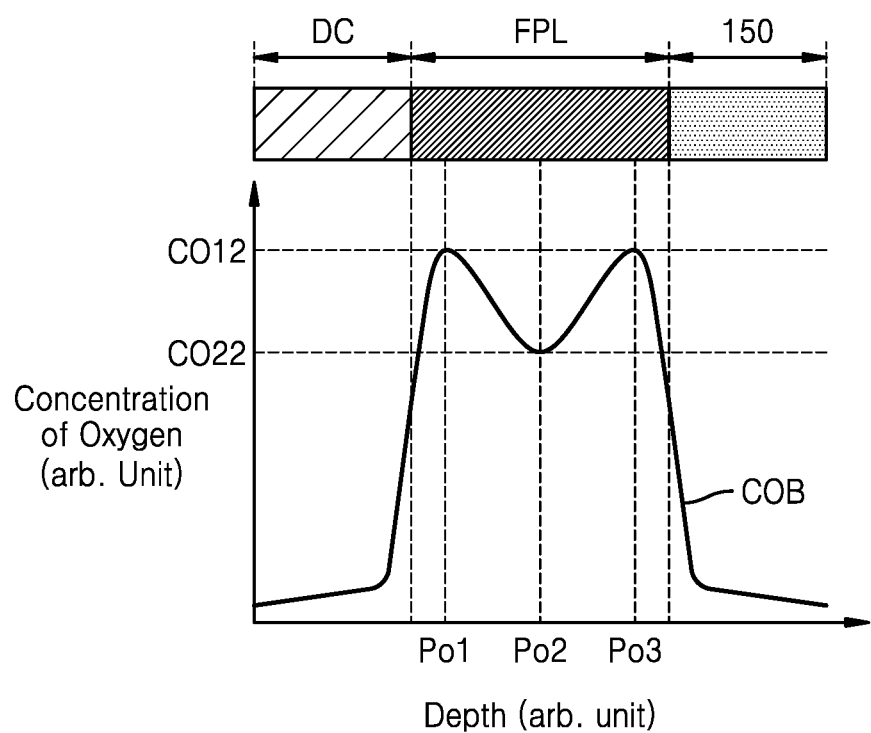

FIGS. 4B and 4C are schematic diagrams illustrating a content profile of nonstoichiometric $SiO_x$ included in a field passivation layer. Referring to FIG. 4B, a field passivation layer FPL may have a first oxygen content profile COA and may have a first oxygen content CO11, which is relatively uniform over a total thickness of the field passivation layer FPL. Here, the first oxygen content CO11 may represent an x value of $SiO_x$, and x may be within a range of about 0.04 to about 0.4. For example, the field passivation layer FPL may uniformly include a semi-insulating material, which includes 0.04 to 0.4 oxygen atoms per one silicon atom, over a total thickness of the field passivation layer FPL.

Referring to FIG. 4C, a field passivation layer FPL may have a second oxygen content profile COB, and the second oxygen content profile COB may have an oxygen content that varies based on a position in a thickness direction of the field passivation layer FPL.

For example, the field passivation layer FPL may have a first oxygen content CO12 at a first position Po1 adjacent to a direct contact DC, and the field passivation layer FPL may have a second oxygen content CO22, which is lower than the first oxygen content CO12, at a second position Po2 located at a center portion of the field passivation layer FPL in the thickness direction thereof. Also, the field passivation layer FPL may have the first oxygen content CO12 at a third position Po3 adjacent to a spacer structure 150. Here, the first oxygen content CO12 and the second oxygen content CO22 may be within a range of about 0.04 to about 0.4.

In other embodiments, the field passivation layer FPL may have the first oxygen content CO12 at the first position Po1, have the lower second oxygen content CO22 than the first oxygen content CO12 at the second position Po2, and have a higher third oxygen content than the first oxygen content CO12 at the third position Po3. On the contrary, the field passivation layer FPL may have the third oxygen content, which is higher than the second oxygen content CO22 and is lower than the first oxygen content CO12, at the third position Po3.

In embodiments, the second oxygen content profile COB may correspond to a profile of an oxygen content of the field passivation layer FPL, which is obtained by sequentially forming a silicon monolayer and an oxygen monolayer through an epitaxy process. For example, the silicon monolayer and the oxygen monolayer may be sequentially and alternately formed a plurality of times through the epitaxy process, and thus, the field passivation layer FPL may have a super-lattice structure. However, the inventive concept is not limited thereto.

For example, it is illustrated that the second oxygen content profile COB of the field passivation layer FPL has two peak contents at the first position Po1 and the third position Po3, but the inventive concept is not limited thereto. For example, the field passivation layer FPL may have a super-lattice structure where a three or more-layer silicon layer and a three or more-layer oxygen layer are alternately stacked. Thus, in this case, the second oxygen content profile COB may have a peak content at three or more positions.

Referring again to FIGS. 1 to 3, according to the embodiments described above, because the field passivation layer FPL is formed between the direct contact DC and the spacer structure 150, depletion may be prevented from being formed in the direct contact DC and a resistance of the direct contact DC may be reduced. Therefore, the integrated circuit device 100 may have good operation characteristics.

Figure 5:
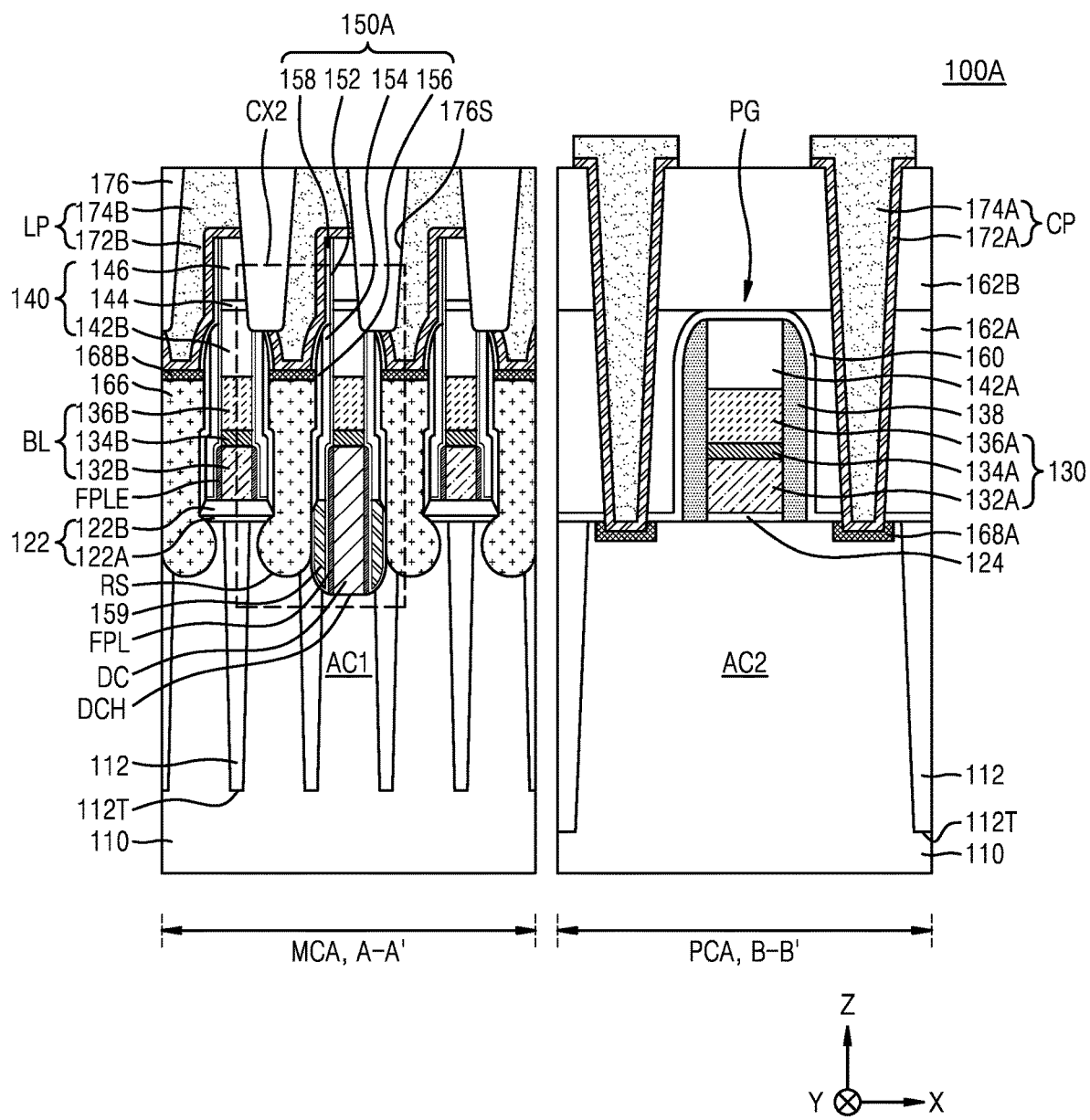
FIG. 5 is a cross-sectional view illustrating an integrated circuit device according to embodiments of the invention.
Figure 6:
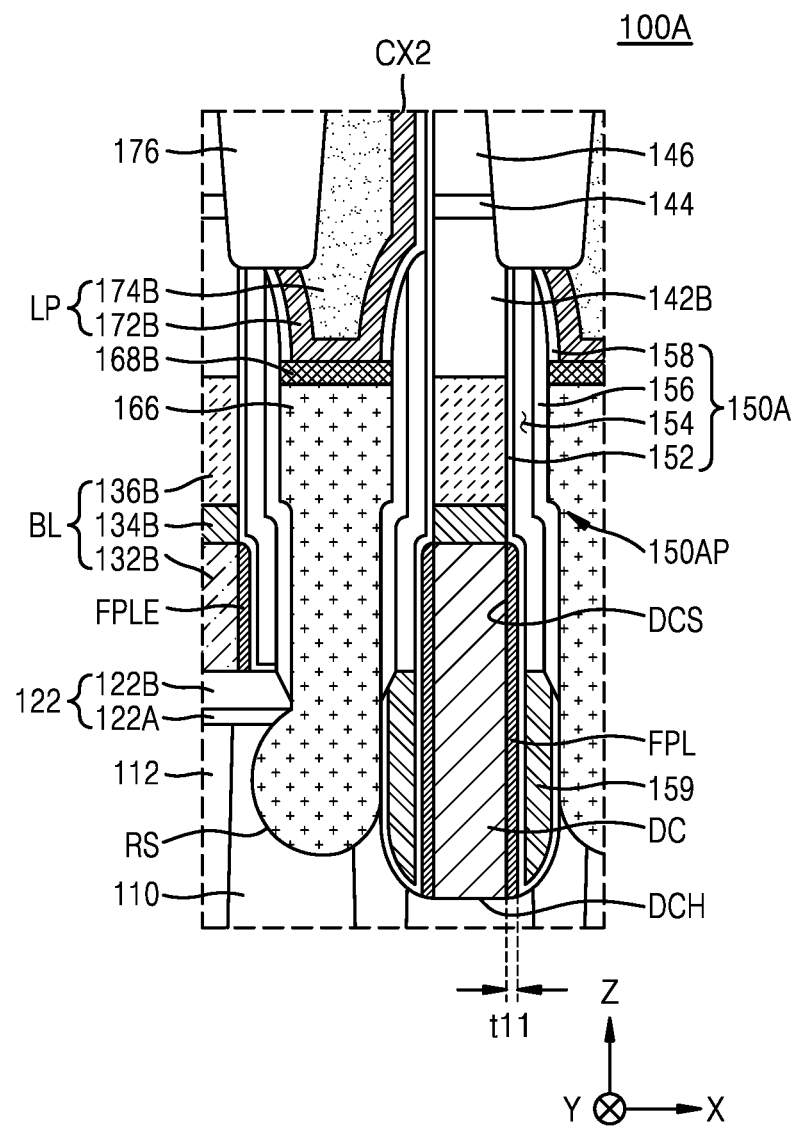
FIG. 6 is an enlarged view of a region CX2 of FIG. 5.

FIG. 5 is a cross-sectional view illustrating an integrated circuit device 100A according to embodiments, and FIG. 6 is an enlarged view of a region CX2 of FIG. 5. In FIGS. 5 and 6, the same reference numerals as FIGS. 1 to 4C refer to like elements. Referring to FIGS. 5 and 6, a spacer structure 150A may include a first spacer layer 152, an air space 154, a second spacer layer 156, and a third spacer layer 158. The first spacer layer 152 may be conformally disposed on a sidewall of each of a plurality of bit lines BL, a sidewall of an insulation capping structure 140, a sidewall of a field passivation layer FPL, and an inner wall of a direct contact hole DCH. The first spacer layer 152 may include silicon nitride. For example, the first spacer layer 152 may have a thickness of about 10 Å to about 50 Å, but is not limited thereto. As illustrated in FIG. 6, a thickness of the first spacer layer 152 may be less than a first thickness t11 of the field passivation layer FPL. Alternatively, a thickness of the first spacer layer 152 may be greater than the first thickness t11 of the field passivation layer FPL.

The second spacer layer 156 may be disposed apart from the first spacer layer 152 by a certain interval, on the sidewall of each of the plurality of bit lines BL and a lower sidewall of the insulation capping structure 140, and the air space 154 may be disposed between the first spacer layer 152 and the second spacer layer 156. The air space 154 may be configured with air having a dielectric constant of about 1.0. Herein, the term "air" may denote a space including other gases which are in air or in a manufacturing process. The second spacer layer 156 may include silicon nitride or silicon oxynitride. The third spacer layer 158 may cover the first spacer layer 152, on an upper sidewall of the insulation capping structure 140 and may extend to a top surface of the second spacer layer 156, to thereby plug an inlet of the air space 154. The third spacer layer 158 may include silicon nitride. A buried insulation layer 149 may surround a lower sidewall of a direct contact DC and may be filled into a remaining space of the direct contact hole DCH. The buried insulation layer 149 may include silicon nitride, silicon oxynitride, silicon oxide, or a combination thereof.

In FIG. 6, the air space 154 and the second spacer layer 156 may be disposed on only a lower sidewall of the insulation capping structure 140 and may not be disposed on an upper sidewall of the insulation capping structure 140. Therefore, a landing pad conductive layer 174б configuring a landing pad LP may be formed to have relatively large volume. However, the inventive concept is not limited thereto. In other embodiments, the air space 154 and the second spacer layer 156 may extend to an upper sidewall of the insulation capping structure 140, and a top surface of the second spacer layer 156 may be at the same level as a top surface of the insulation capping structure 140.

Figure 7:
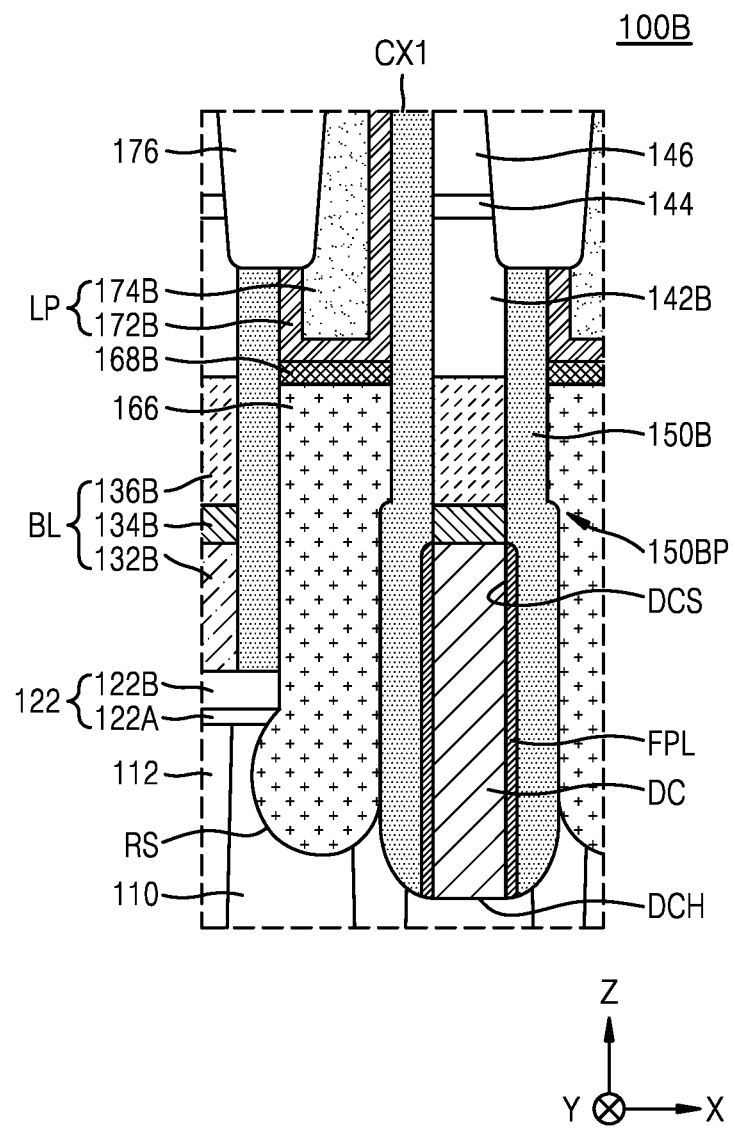
FIG. 7 is a cross-sectional view illustrating an integrated circuit device according to embodiments of the invention.

In embodiments, as in FIG. 7, the field passivation layer FPL may be formed on a sidewall DCS of the direct contact DC and may not be disposed on an upper conductive pattern 136б and a sidewall of the insulation capping structure 140. The field passivation layer FPL may also protrude outward with respect to the upper conductive pattern 136B. Also, the first spacer layer 152 may conformally cover the field passivation layer FPL; therefore, the spacer structure 150A may include a protrusion portion 150AP at a portion thereof corresponding to a top surface of the field passivation layer FPL (for example, at portions of the first spacer layer 152, the air space 154, and the second spacer layer 156 each corresponding to the top surface of the field passivation layer FPL).

Also, a top surface of each of a plurality of conductive plugs 166 may be at a level which is higher than the top surface of the field passivation layer FPL or the protrusion portion 150AP. Therefore, an upper width of each of the plurality of conductive plugs 166 may be greater than a center width thereof (for example, a width of a portion between the lower conductive pattern 132б and the direct contact DC).

According to the embodiments described above, because the field passivation layer FPL is formed between the direct contact DC and the spacer structure 150A, depletion may be prevented from being formed in the direct contact DC and a conductivity of the direct contact DC may be increased. Therefore, the integrated circuit device 100A may have improved operating characteristics.

FIG. 7 is a cross-sectional view illustrating an integrated circuit device 100B according to additional embodiments. FIG. 7 is an enlarged cross-sectional view corresponding to an enlarged view of the region CX1 of FIG. 2. In FIG. 7, the same reference numerals as FIGS. 1 to 6 refer to like elements. Referring to FIG. 7, a field passivation layer FPL may be disposed on both sidewalls DCS of a direct contact DC, but may not be disposed on a sidewall of a lower conductive pattern 132B. For example, the extension portion FPLE illustrated in FIGS. 2 and 3 may be omitted, and a sidewall of the lower conductive pattern 132B may directly contact a spacer structure 150B.

In embodiments, the lower conductive pattern 132B may include silicon (Si), germanium (Ge), tungsten (W), tungsten nitride (WN), cobalt (Co), nickel (Ni), aluminum (Al), molybdenum (Mo), ruthenium (Ru), titanium (Ti), titanium nitride (TiN), tantalum (Ta), tantalum nitride (TaN), copper (Cu), or a combination thereof. In some embodiments, after a bit line BL is formed, only the sidewall DCS of the direct contact DC may be exposed in a state where a sidewall of a lower conductive pattern 132B is not exposed, and the field passivation layer FPL may be formed on the exposed sidewall DCS. In other embodiments, the lower conductive pattern 132B may include a metal material, the direct contact DC may include polysilicon, and the field passivation layer FPL may be selectively formed on the direct contact DC through an epitaxy process of forming the field passivation layer FPL.

In embodiments, the spacer structure 150B may include a protrusion portion 150BP at a portion thereof which is disposed on the sidewall DCS of the direct contact DC. This spacer structure 150B, which is disposed on a sidewall of the lower conductive pattern 132B, may include a substantially flat sidewall without forming a step, a kink, or a protrusion portion.

Figure 8:
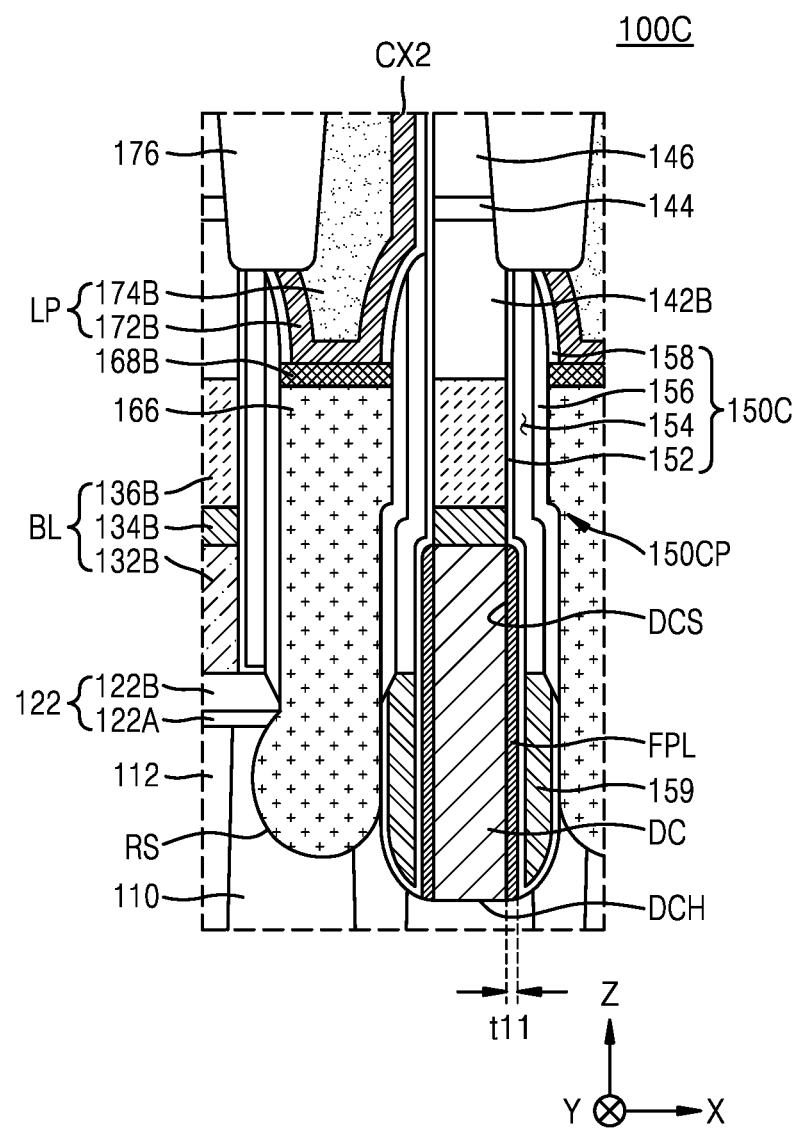
FIG. 8 is a cross-sectional view illustrating an integrated circuit device according to embodiments of the invention.

FIG. 8 is a cross-sectional view illustrating an integrated circuit device 100C according to embodiments. FIG. 8 is an enlarged cross-sectional view corresponding to an enlarged view of the region CX2 of FIG. 5. In FIG. 8, the same reference numerals as FIGS. 1 to 7 refer to like elements. Referring to FIG. 8, a field passivation layer FPL may be disposed on both sidewalls DCS of a direct contact DC, but may not be disposed on a sidewall of a lower conductive pattern 132B. For example, the extension portion FPLE illustrated in FIGS. 2 and 3 may be omitted, and a sidewall of the lower conductive pattern 132B may directly contact a spacer structure 150C.

In embodiments, the lower conductive pattern 132B may include Si, Ge, W, WN, Co, Ni, Al, Mo, Ru, Ti, TiN, Ta, TaN, Cu, or combinations thereof. In some embodiments, after a bit line BL is formed, only the sidewall DCS of the direct contact DC may be exposed in a state where a sidewall of a lower conductive pattern 132B is not exposed, and the field passivation layer FPL may be formed on the exposed sidewall DCS. In other embodiments, the lower conductive pattern 132B may include a metal material, the direct contact DC may include polysilicon, and the field passivation layer FPL may be selectively formed on the direct contact DC through an epitaxy process of forming the field passivation layer FPL.

In embodiments, the spacer structure 150C may include a protrusion portion 150CP at a portion thereof which is disposed on the sidewall DCS of the direct contact DC. And, the spacer structure 150C, which is disposed on a sidewall of the lower conductive pattern 132B, may include a substantially flat sidewall without forming a step, a kink, or a protrusion portion.

FIGS. 9A to 9M are cross-sectional views illustrating in process sequence a method of manufacturing an integrated circuit device, according to embodiments. A method of manufacturing the integrated circuit device 100 illustrated in FIGS. 1 to 3 will be described below with reference to FIGS. 9A to 9M.

Figure 9A:
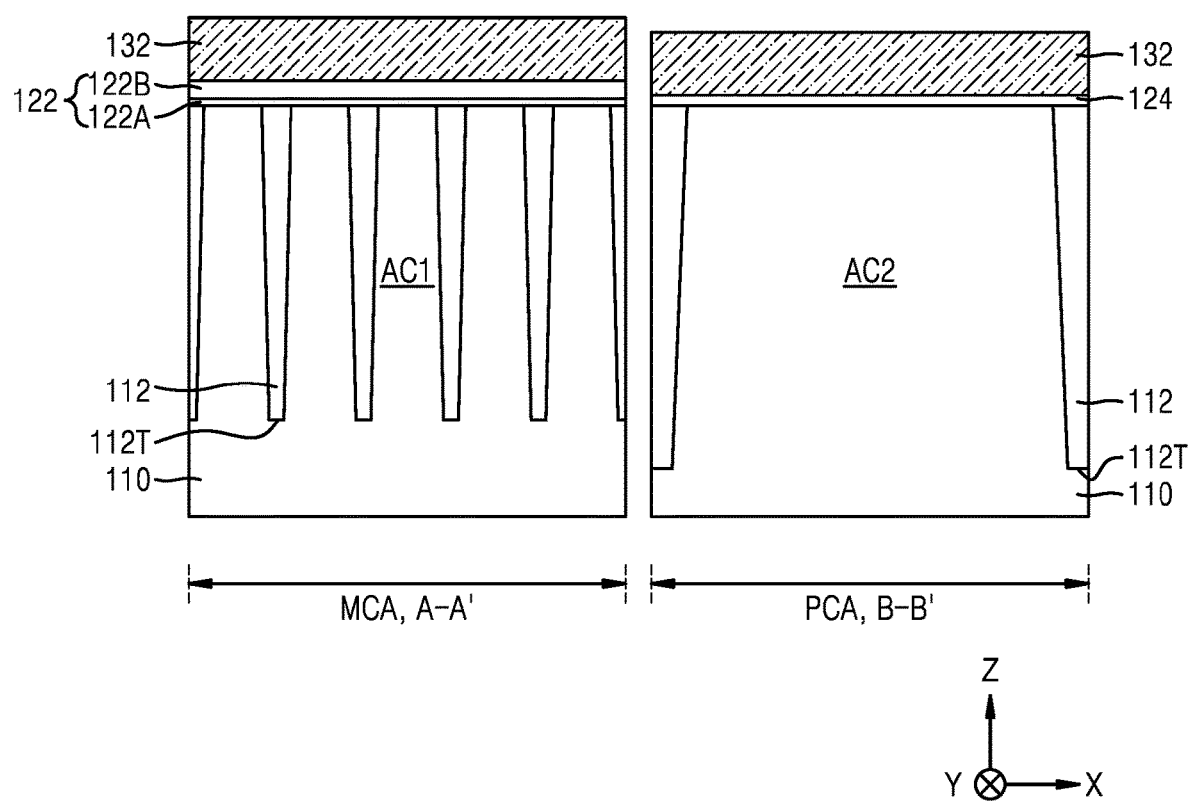
FIGS. 9A to 9M are cross-sectional views illustrating a sequence of process steps, which may be utilized during a method of manufacturing an integrated circuit device, according to embodiments of the invention.

Referring to FIG. 9A, by forming a plurality of isolation trenches 112T and a plurality of isolation layers 112 in a substrate 110, which includes a cell array area MCA and a peripheral circuit area PCA, a plurality of first active areas AC1 may be defined in the cell array area MCA of the substrate 110, and at least one second active area AC2 may be defined in the peripheral circuit area PCA. In addition, a plurality of word line trenches (not shown), which extend in parallel, may be formed in the substrate 110 in the cell array area MCA. A resultant material with the plurality of word line trenches formed therein may be cleaned. And, then, a plurality of gate dielectric layers (not shown), a plurality of gate electrodes (not shown), and a plurality of capping insulation layers (not shown) may be formed in the plurality of word line trenches. A plurality of source/drain areas may be respectively formed on the plurality of first active areas AC1 by implanting impurity ions on both sides of the plurality of gate electrodes in the plurality of first active areas AC1.

Subsequently, a buffer layer 122, which includes a first insulation layer 122A and a second insulation layer 122B, may be formed on the substrate 110 in the cell array area MCA, and a gate dielectric layer 124 may be formed on the substrate 110 in the peripheral circuit area PCA. Next, a lower conductive layer 132 may be formed on the buffer layer 122 of the cell array area MCA and the gate dielectric layer 124 of the peripheral circuit area PCA. In some embodiments, the lower conductive layer 132 may include Si, Ge, W, WN, Co, Ni, Al, Mo, Ru, Ti, TiN, Ta, TaN, Cu, or combinations thereof. For example, the lower conductive layer 132 may include polysilicon.

Figure 9B:
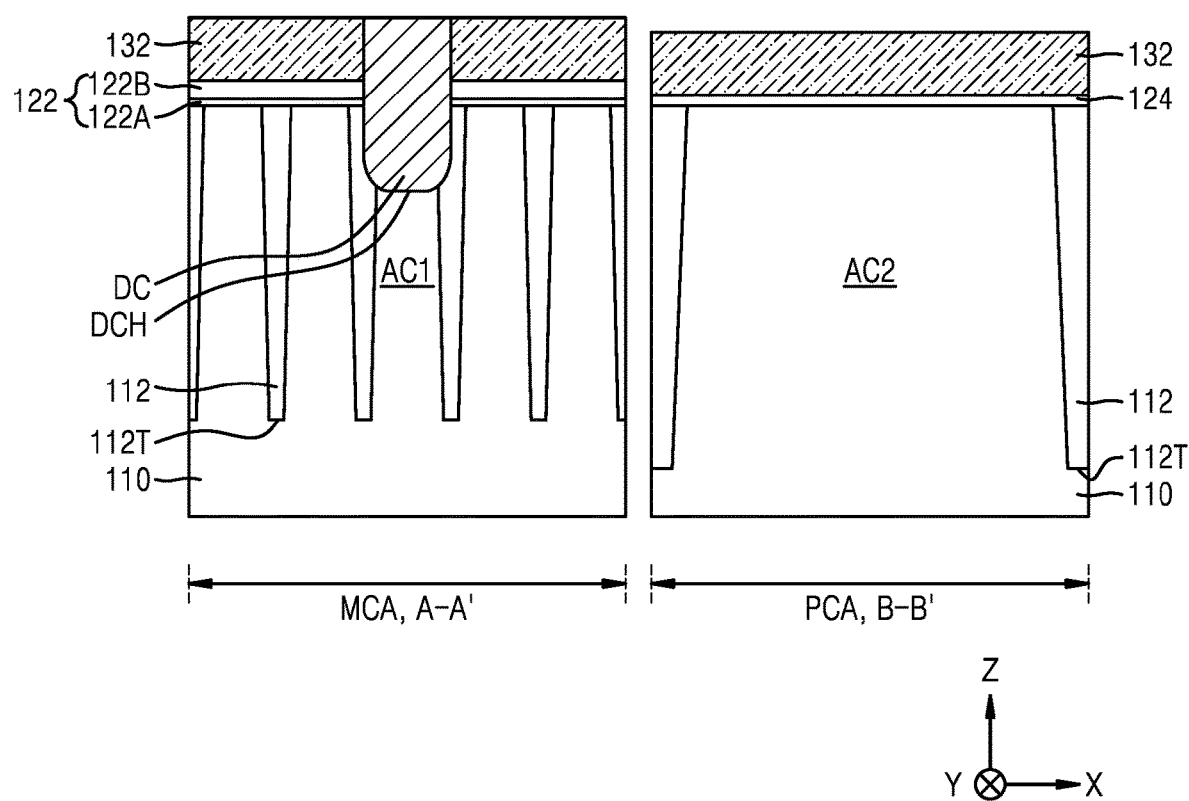

Referring to FIG. 9B, a first mask pattern (not shown) may be formed on the lower conductive layer 132, a lower conductive layer 132 exposed through an opening (not shown) of the first mask pattern may be etched in the cell array area MCA subsequently, and a direct contact hole DCH exposing the first active area AC1 of the substrate 110 may be formed by etching a portion of the substrate 110 and a portion of an isolation layer 112 each exposed by the etching.

Subsequently, the first mask pattern may be removed, and a direct contact DC may be formed in the direct contact hole DCH. During a process of forming the direct contact DC, a conductive layer having a thickness sufficient to fill the direct contact hole DCH may be formed in the direct contact hole DCH and on the lower conductive layer 132. This conductive layer may then be etched back to remain in only the direct contact hole DCH. The conductive layer may include polysilicon.

Figure 9C:
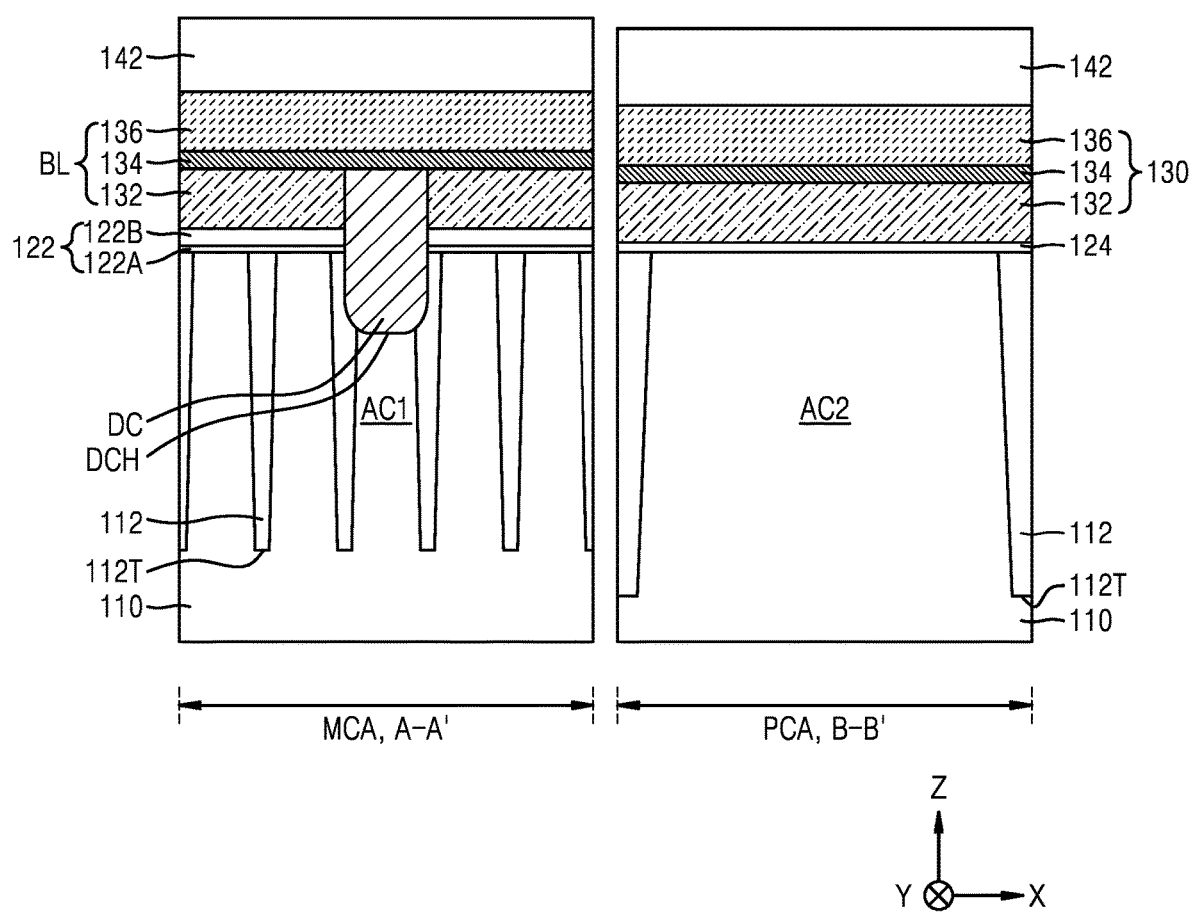

Referring to FIG. 9C, a middle conductive layer 134, an upper conductive layer 136, and a lower capping layer 142 may be sequentially formed on the direct contact DC and on the lower conductive layer 132 in the cell array area MCA and the peripheral circuit area PCA. Each of the middle conductive layer 134 and the upper conductive layer 136 may include TiN, TiSiN, W, tungsten silicide, or a combination thereof. The lower capping layer 142 may include silicon nitride.

Figure 9D:
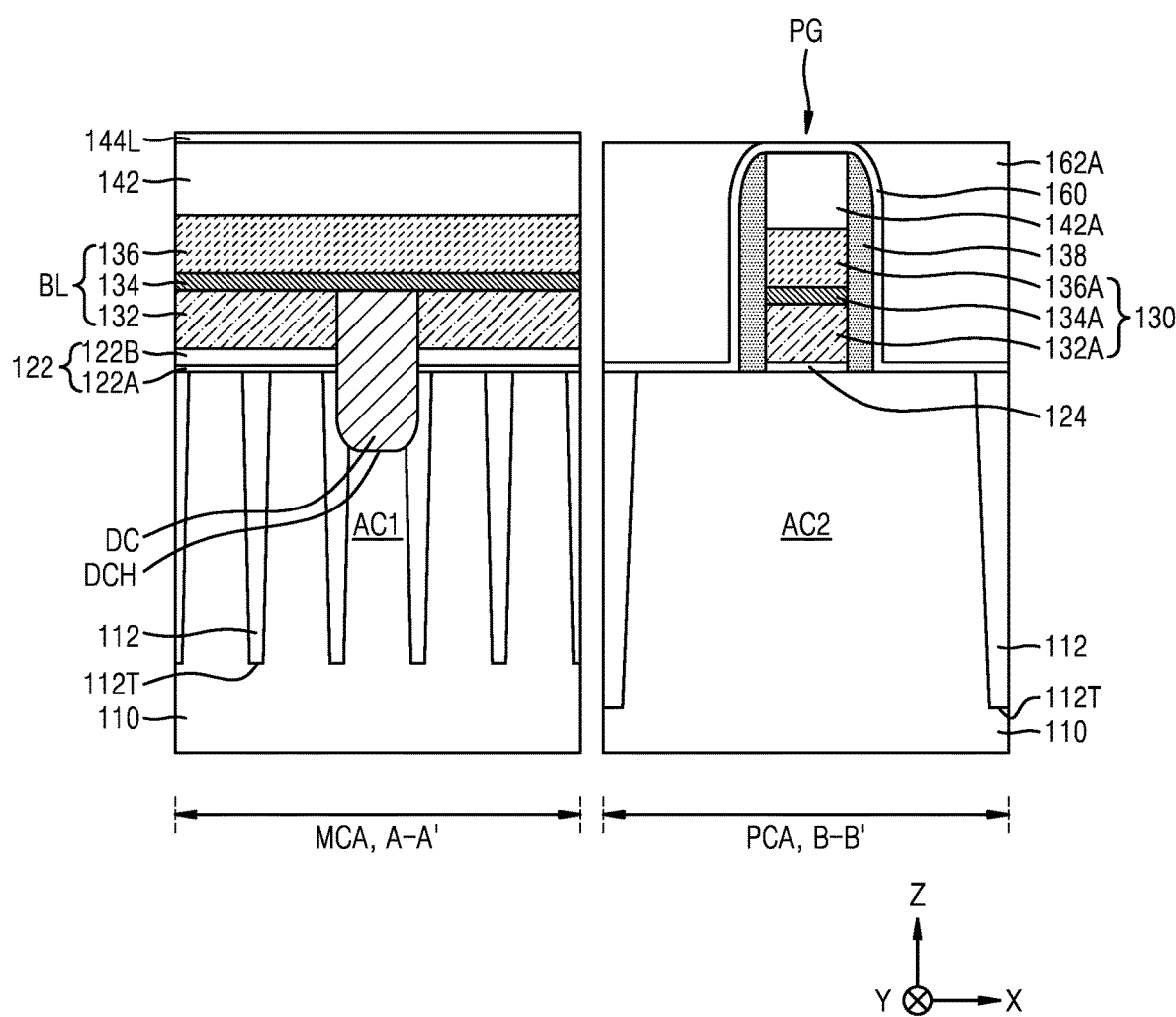

Referring to FIG. 9D, in the peripheral circuit area PCA in a state where a mask pattern (not shown) covers the cell array area MCA, the gate dielectric layer 124, the lower conductive layer 132, the middle conductive layer 134, the upper conductive layer 136, and the lower capping layer 142 in the peripheral circuit area PCA are patterned to form a gate electrode 130 including a lower conductive pattern 132A, a middle conductive pattern 134A, and an upper conductive pattern 136A on the gate dielectric layer 124 and to form a gate capping pattern 142A covering the gate electrode 130. Subsequently, an insulation spacer 138 may be formed on both sidewalls of a gate structure PG which is formed in a stack structure of the gate dielectric layer 124, the gate electrode 130, and the gate capping pattern 142A, and an ion implantation process of forming a source/drain area in the second active area AC2 may be performed at both sides of the gate structure PG.

Subsequently, the lower capping layer 142 may be exposed in the cell array area MCA by removing a mask pattern which has covered the cell array area MCA. An insulation layer 144L may also be formed on the lower capping layer 142 in the cell array area MCA, and a passivation layer 160 (covering the gate structure PG and the insulation spacer 138) may be formed in the peripheral circuit area PCA. Next, an interlayer insulation layer 162A filling a space around the gate structure PG may be formed in the peripheral circuit area PCA. The insulation layer 144L may be formed of the same material as that of the passivation layer 160, but is not limited thereto.

Figure 9E:
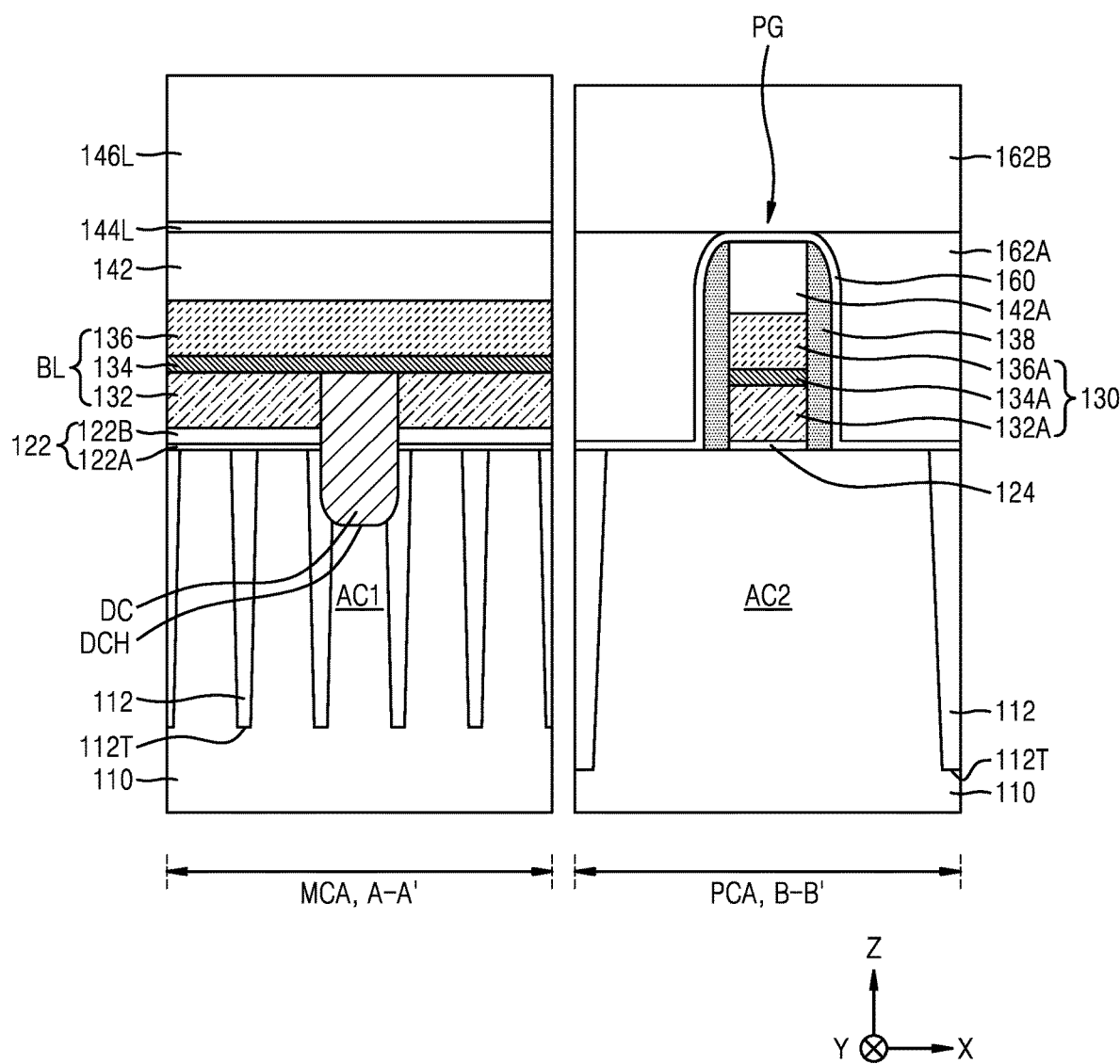
Figure 9F:
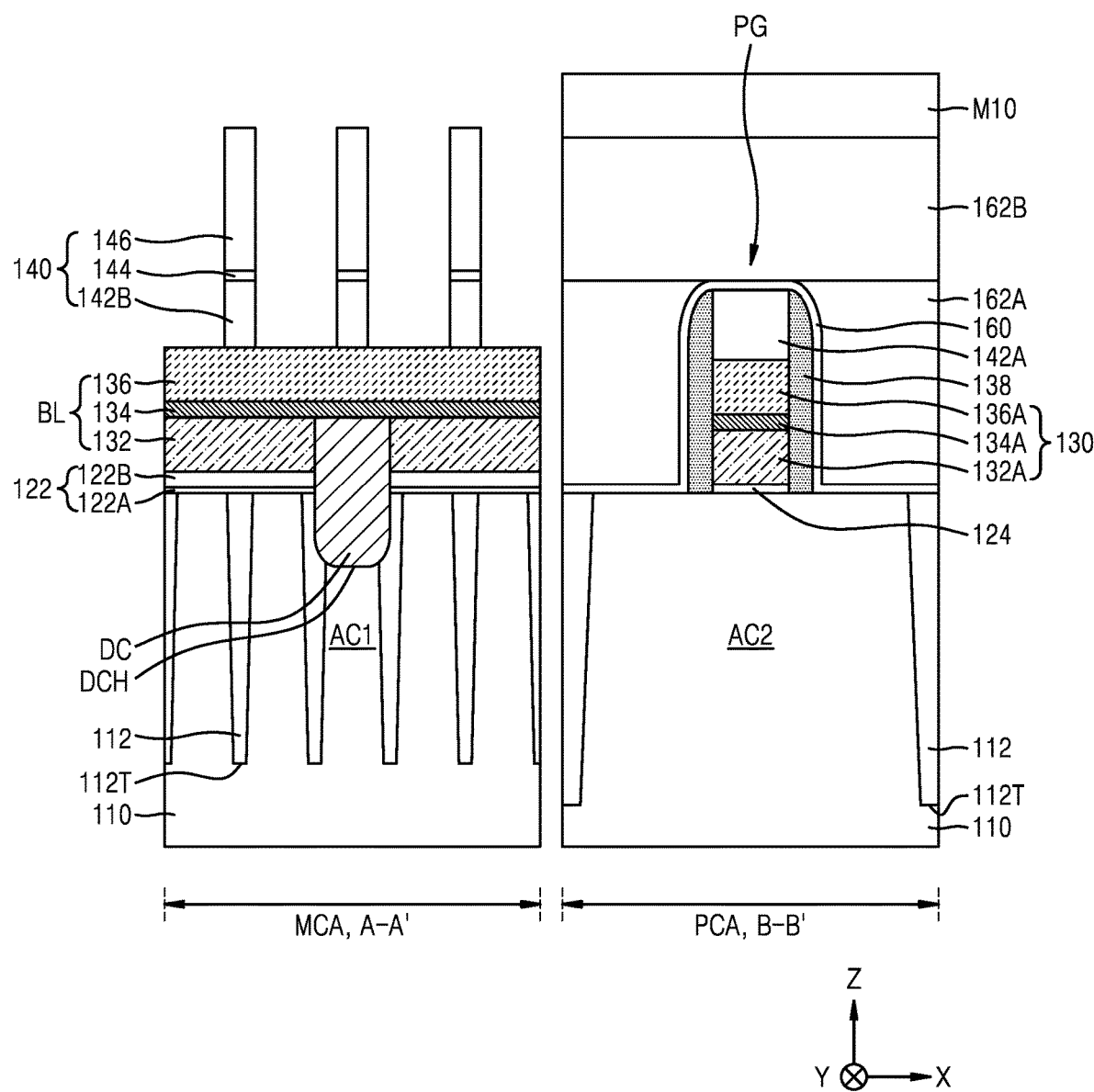

Referring to FIG. 9E, an upper insulation capping layer 162B may be formed on the passivation layer 160 and the interlayer insulation layer 162A in the peripheral circuit area PCA. Subsequently, an upper capping layer 146L may be formed on the insulation layer 144L in the cell array area MCA. Referring to FIG. 9F, a mask pattern M10 may be formed on the peripheral circuit area PCA. And, a lower capping pattern 142B, an insulation layer pattern 144, and an upper capping pattern 146 may be sequentially stacked on the upper conductive layer 136, and may be formed by patterning the upper capping layer 146L, the insulation layer 144L, and the lower capping layer 142 in the cell array area MCA. Here, the lower capping pattern 142B, the insulation layer pattern 144, and the upper capping pattern 146 may be referred to as an insulation capping structure 140.

Figure 9G:
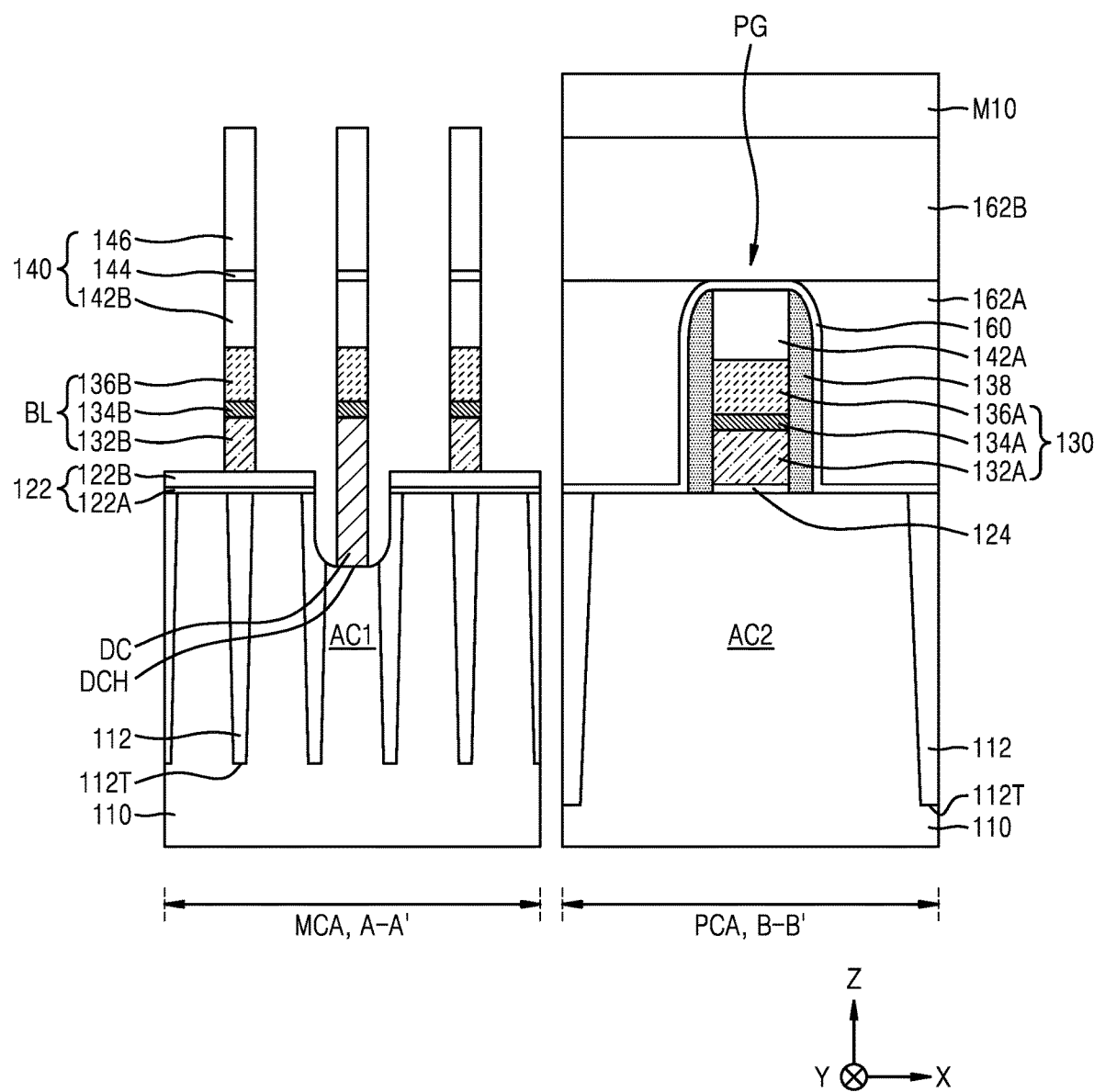

Referring to FIG. 9G, a plurality of bit lines BL including a lower conductive pattern 132B, a middle conductive pattern 134B, and an upper conductive pattern 136B may be formed by etching the upper conductive layer 136, the middle conductive layer 134, and the lower conductive layer 132. During this etching, the capping pattern 142B, the insulation layer pattern 144, and the upper capping pattern 146 are used as an etch mask in the cell array area MCA.

In a process of forming the plurality of bit lines BL, a portion of a sidewall of the direct contact DC may be removed, and a portion of the direct contact hole DCH may be exposed.

Figure 9H:
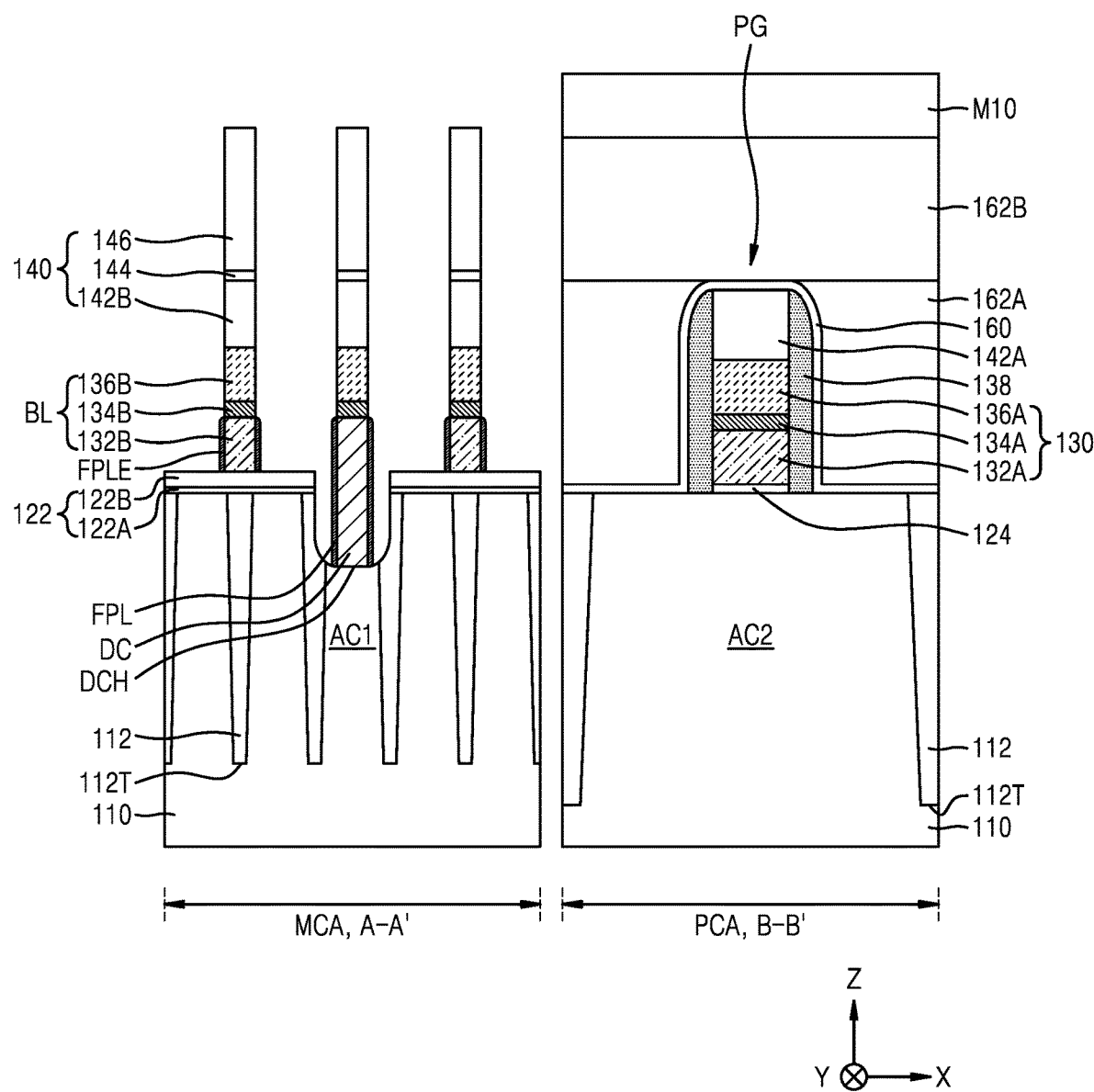

Referring to FIG. 9H, a field passivation layer FPL may be formed on the sidewall of the direct contact DC. The field passivation layer FPL may include nonstoichiometric $SiO_x$ ($0.04 \leq x \leq 0.4$). The field passivation layer FPL may be formed to have a thickness of about 25 Å or less. In embodiments, the field passivation layer FPL may be selectively formed on the sidewall of the direct contact DC through an epitaxy process. The epitaxy process may include a chemical vapor deposition (CVD) process such as vapor-phase epitaxy (VPE) or ultra-high vacuum chemical vapor deposition (UHV-CVD), a molecular beam epitaxy process, or a combination thereof. In the epitaxy process, a liquid or gaseous precursor may be used as a precursor for forming the field passivation layer FPL.

In embodiments, a silicon monolayer may be formed by supplying a silicon source onto an exposed sidewall of the direct contact DC for a first period of time, the supply of the silicon source may be cut off subsequently, and subsequently an oxygen source is supplied for a second period of time to cause intermixing of silicon and oxygen, thereby forming the field passivation layer FPL. For example, a ratio of a supply time of a silicon source to a supply time of an oxygen source may vary for forming a nonstoichiometric $SiO_x$ material layer having a desired oxygen content.

In embodiments, a silicon monolayer may be formed by supplying a silicon source onto the exposed sidewall of the direct contact DC for the first period of time, the supply of the silicon source may be cut off subsequently, an oxygen source may be supplied for the second period of time subsequently, and an oxygen content in a thickness direction of the field passivation layer FPL may be adjusted by adjusting a process temperature.

In embodiments, a silicon monolayer may be formed by supplying a silicon source onto the exposed sidewall of the direct contact DC for the first period of time, the supply of the silicon source may be cut off subsequently, an oxygen monolayer may be formed by supplying an oxygen source for the second period of time subsequently, and a silicon monolayer may be formed by supplying a silicon source for a third period of time again. For example, a ratio of a supply time of a silicon source to a supply time of an oxygen source may vary for forming a nonstoichiometric $SiO_x$ material layer having a desired oxygen content. Moreover, according to some embodiments, the number of times the silicon source is supplied may differ from the number of times the oxygen source is supplied.

In embodiments, first impurities may be in-situ doped in an epitaxy process of forming the field passivation layer FPL. Additionally, laser annealing may also be performed on the field passivation layer FPL. The first impurities may include P, As, Bi, or Sb. Advantageously, the bandgap energy of the field passivation layer FPL may be adjusted based on a concentration of the first impurities.

In other embodiments, when the lower conductive pattern 132B includes polysilicon, the field passivation layer FPL may be formed on an exposed sidewall of the lower conductive pattern 132B in the epitaxy process. A portion of the field passivation layer FPL disposed on the lower conductive pattern 132B may be referred to as an extension portion FPLE. The field passivation layer FPL may be formed to have a relatively small thickness, the direct contact hole DCH may remain without being filled.

In further embodiments, the field passivation layer FPL may be selectively formed on an exposed sidewall of the direct contact DC by an epitaxy process. Accordingly, the field passivation layer FPL may not be formed on a sidewall of the upper conductive pattern 134B and a sidewall of the insulation capping structure 140. Also, the field passivation layer FPL may be formed on the exposed sidewall of the direct contact DC to have a uniform thickness (for example, about 25 Å or less) which is relatively small.

Figure 9I:
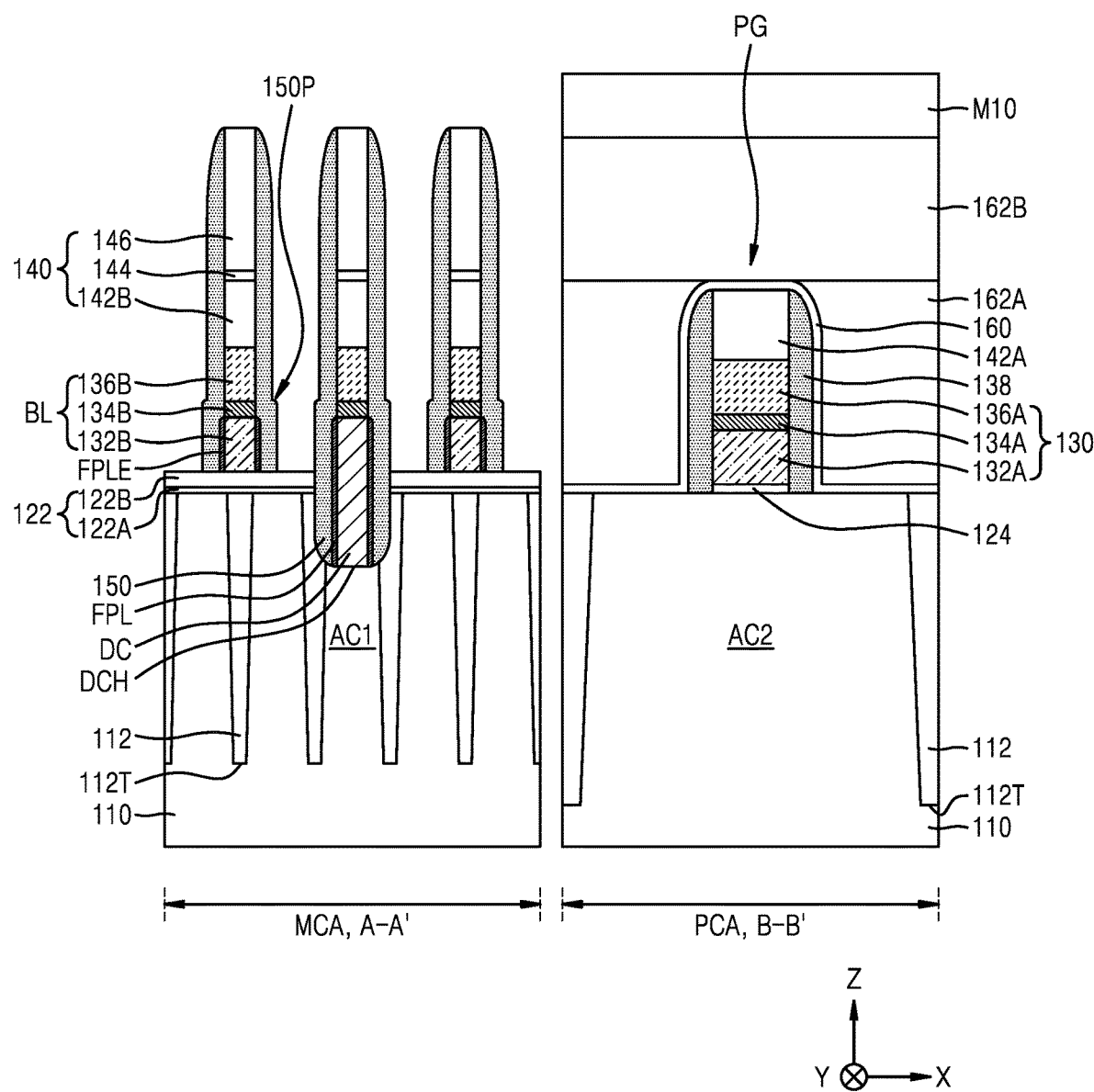

Referring to FIG. 9I, a spacer structure 150 may be formed on a sidewall of each of the plurality of bit lines BL and the sidewall of the direct contact DC. In embodiments, an insulation layer (not shown) may be conformally formed on the sidewall and a top surface of each of the plurality of bit lines BL. Then, the spacer structure 150 may remain on the sidewall of each of the plurality of bit lines BL by performing an anisotropic etching process on the insulation layer. The spacer structure 150 may be formed of silicon nitride.

As illustrated in FIG. 9I, the field passivation layer FPL may be selectively formed on the exposed sidewall of the direct contact DC and the spacer structure 150 may be formed to have a uniform thickness over a total height thereof, the spacer structure 150 may include a protrusion portion 150P at a portion thereof which covers a top surface of the field passivation layer FPL. However, a shape of the protrusion portion 150P is not limited to a shape illustrated in FIG. 9I.

In some embodiments, the spacer structure 150 may be formed to be filled into the direct contact hole DCH. In other embodiments, the spacer structure 150 may be formed on an inner wall of the direct contact hole DCH to have a certain thickness, and a buried insulation layer (not shown) filled into the direct contact hole DCH may be further formed on the spacer structure 150.

Figure 9J:
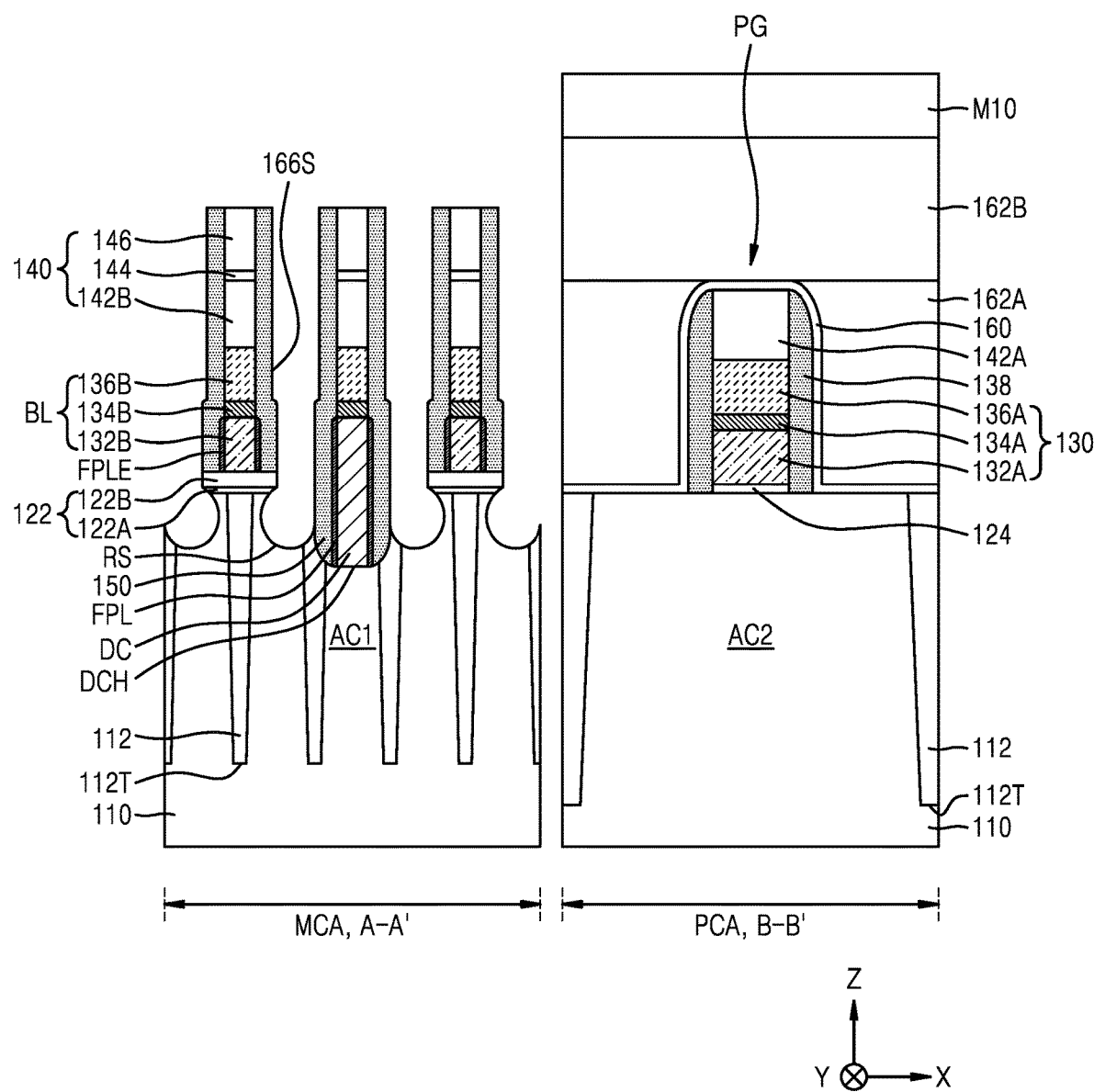

Referring to FIG. 9J, a plurality of insulation fences (not shown) may be each formed between two adjacent bit lines BL of the plurality of bit lines BL in the cell array area MCA. Therefore, a contact space 166S may be defined between two adjacent insulation fences of the plurality of insulation fences and between two bit lines BL. While the plurality of insulation fences are being formed, a portion of an upper portion of each of the insulation capping structure 140 and the spacer structure 150 that are exposed to an etch atmosphere may be removed. Thus, a height of each of the insulation capping structure 140 and the spacer structure 150 may be reduced. In other embodiments, after the plurality of insulation fences are formed, an etch-back process may be further performed for decreasing a height of each of the insulation capping structure 140 and the spacer structure 150. Subsequently, by removing a portion of each of the buffer layer 122 and the substrate 110 (each exposed through the plurality of contact spaces 166S), a plurality of recess spaces RS exposing a first active area AC1 of the substrate 110 may each be formed between two adjacent bit lines BL of the plurality of bit lines BL.

Figure 9K:
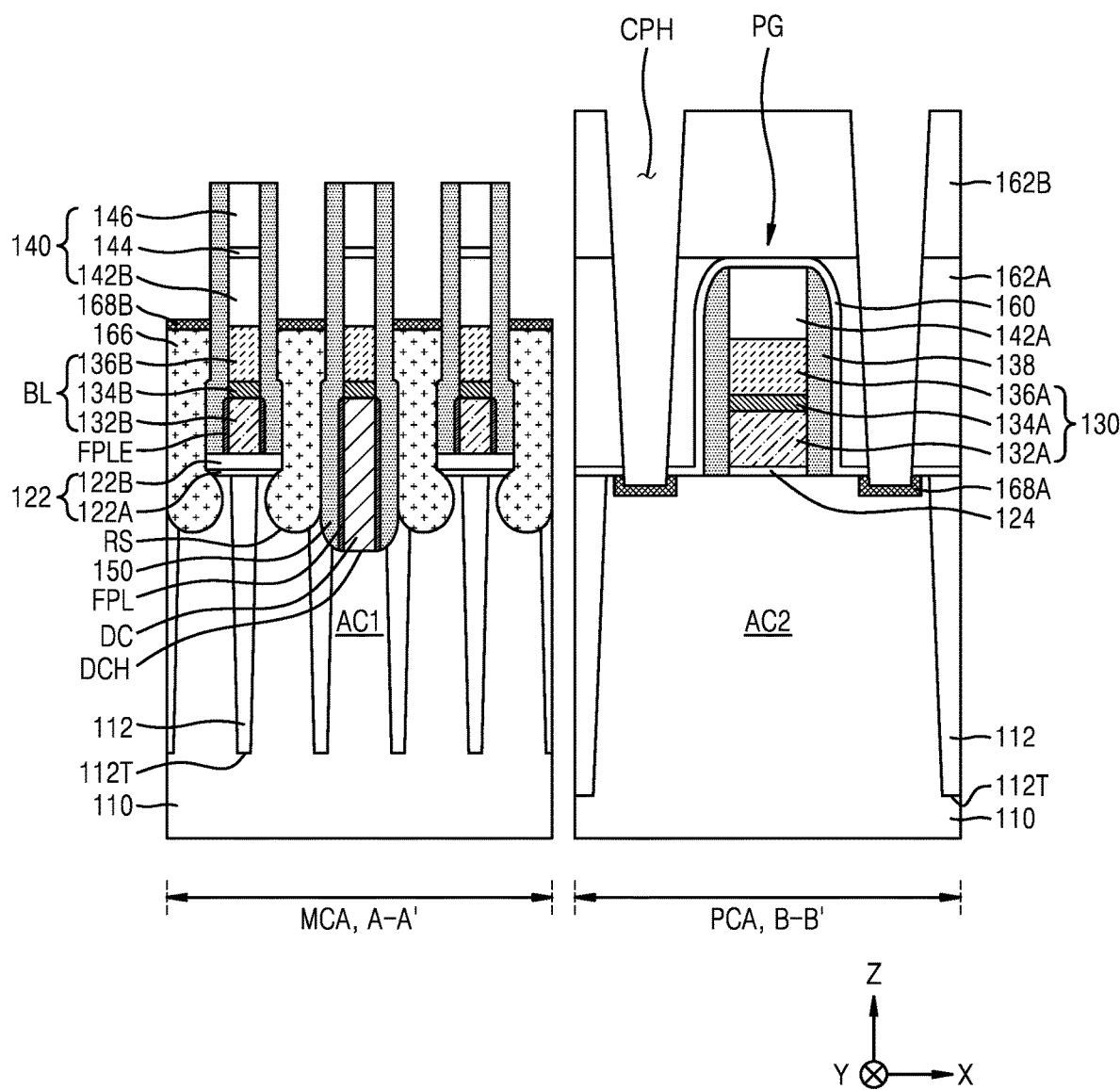

Referring to FIG. 9K, a plurality of conductive plugs 166, which are respectively filled into the plurality of recess spaces RS and are each filled into a portion of a corresponding contact space 166S between two adjacent bit lines BL of the plurality of bit lines BL, may each be formed between two adjacent bit lines BL of the plurality of bit lines BL in the cell array area MCA. But, because the field passivation layer FPL is selectively formed on the exposed sidewall of the direct contact DC and the spacer structure 150 includes the protrusion portion 150P at the portion thereof which covers the top surface of the field passivation layer FPL, as illustrated in FIG. 9K, a width of an upper portion of each of the plurality of conductive plugs 166 may be greater than that of a center portion thereof. Subsequently, a top surface of the upper insulation capping layer 162B may be exposed by removing a mask pattern M10, in the peripheral circuit area PCA. Next, a plurality of contact holes CPH exposing a second active area AC2 of the substrate 110 may be formed by etching the upper insulation capping layer 162B, the interlayer insulation layer 162A, and the passivation layer 160.

A metal silicide layer 168B may then be formed on the conductive plug 166 exposed through the plurality of contact spaces 166S in the cell array area MCA, and a metal silicide layer 168A may be formed on a surface of the second active area AC2 exposed through the plurality of contact holes CPH in the peripheral circuit area PCA. The metal silicide layers 168A and 168B may be formed simultaneously, or may be formed using separate processes.

Figure 9L:
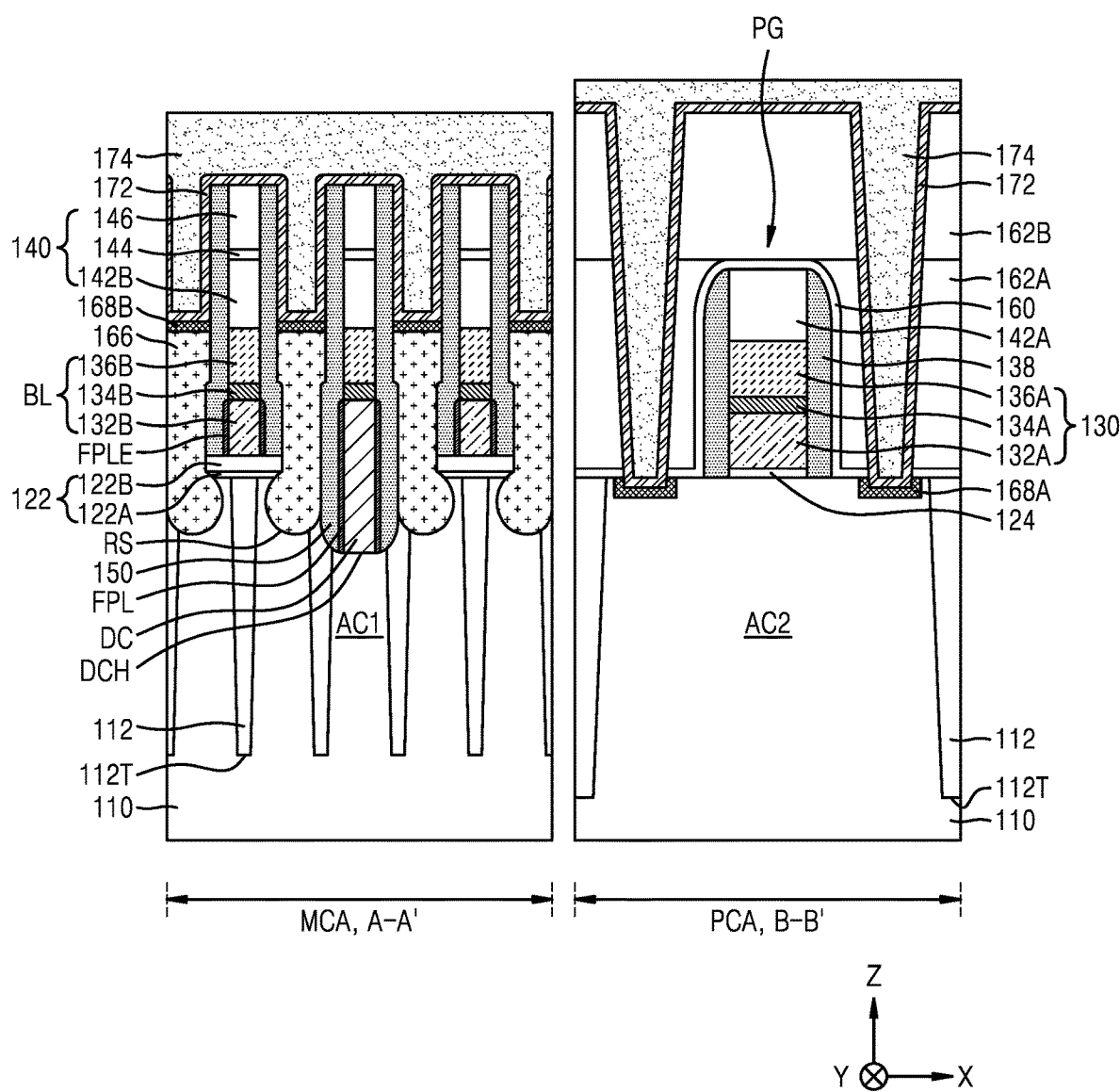
Figure 9M:
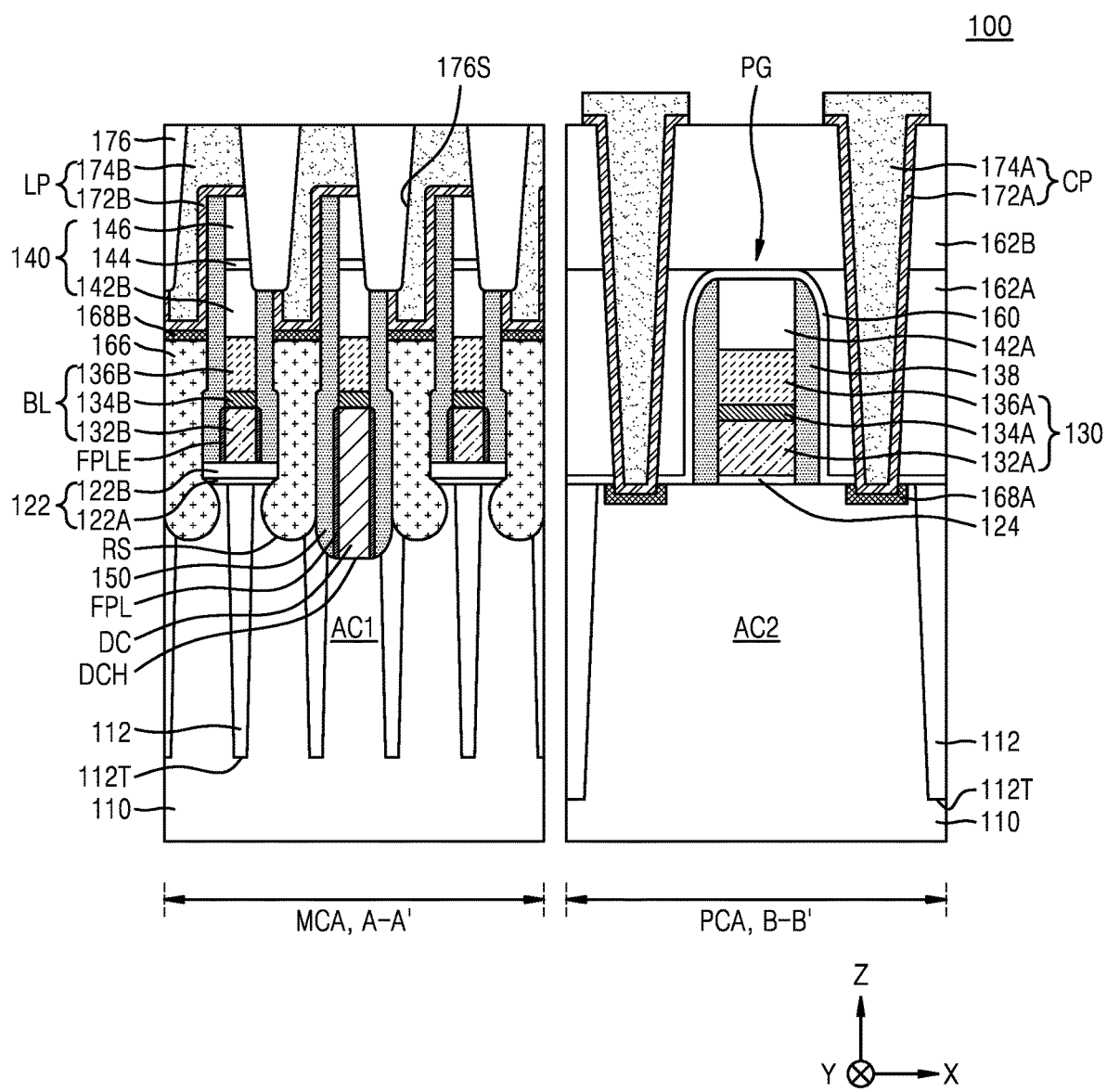

Referring to FIG. 9L, a conductive barrier layer 172 and a conductive layer 174 (each covering an exposed surface) may be formed on the substrate 110 in the cell array area MCA and the peripheral circuit area PCA. Referring to FIG. 9M, by patterning the conductive barrier layer 172 and the conductive layer 174 in the cell array area MCA and the peripheral circuit area PCA, a plurality of land pads LP including a conductive barrier layer 172B and a landing pad conductive layer 174B may be formed in the cell array area MCA; and, a plurality of contact plugs CP (including a conductive barrier layer 172A and a landing pad conductive layer 174A) may be formed in the peripheral circuit area PCA.

As seen by a plan view, as illustrated in FIG. 1, the plurality of landing pads LP may have a shape corresponding to a plurality of island patterns. The plurality of landing pads LP may be formed to vertically overlap a part of the plurality of bit lines BL above the metal silicide layer 168B. Because the plurality of landing pads LP are formed in an island pattern shape, an insulation space 176S surrounding the plurality of landing pads LP may be formed, and at this time, the upper capping pattern 146 may be exposed at an inner wall of the insulation space 176S.

Subsequently, the insulation pattern 176 may be formed of an insulating material on the inner wall of the insulation space 176S in the cell array area MCA. The insulation pattern 176 may be formed by a spin coating process, a CVD process, a flowable CVD process, and/or the like.

Subsequently, a capacitor lower electrode (not shown) may be formed on the plurality of landing pads LP in the cell array area MCA. The integrated circuit device 100 may be completely formed by the manufacturing method described above.

According to the manufacturing method, an enhanced field passivation layer FPL, which advantageously includes nonstoichiometric $SiO_x$ ($0.04 \leq x \leq 0.4$), may be formed on an exposed sidewall DCS of the direct contact DC by an epitaxy process after a patterning process performed on the bit lines BL. The field passivation layer FPL may have an oxygen content adjusted based on intermixing of a silicon monolayer and an oxygen monolayer, and thus, may have its bandgap energy similarly adjusted.

In the integrated circuit device 100 manufactured by the manufacturing method described above, because the field passivation layer FPL is formed between the direct contact DC and the spacer structure 150, undesirable depletion may be prevented from being formed in the direct contact DC, and a conductivity of the direct contact DC may be increased. Therefore, the integrated circuit device 100 may have enhanced operating characteristics.

In a process described above with reference to FIG. 9I, a sacrificial spacer structure (not shown) may be formed by forming a first spacer layer on a sidewall of the bit line BL, sequentially forming a sacrificial layer (not shown) and a second spacer layer 156 on the first spacer layer 152, and performing an anisotropic etching process on the first spacer layer 152, the sacrificial layer, and the second spacer layer 156. Subsequently, by performing an etch-back process of removing a portion of an upper portion of the sacrificial spacer structure, a height of the sacrificial spacer structure may decrease, and a third spacer layer 158 may be further formed on an upper sidewall of the insulation capping structure 140 and the second spacer layer 156 to have a certain thickness.

Subsequently, in a process described above with reference to FIG. 9M, after the landing pad LP is formed, the sacrificial spacer layer exposed at the insulation space 176S may be removed by a wet etching process. An air space 154 may be formed in a space from which the sacrificial spacer layer is removed, and thus, the spacer structure 150A may be formed. In this case, the integrated circuit device 100b described above with reference to FIGS. 5 and 6 may be formed.

While the inventive concept has been particularly shown and described with reference to embodiments thereof, it will be understood that various changes in form and details may be made therein without departing from the spirit and scope of the following claims.

What is claimed is:

1. An integrated circuit device, comprising:
   a substrate having an active area therein;
   a bit line on the substrate;
   a direct contact, which extends between the active area and the bit line and electrically couples the bit line to a portion of the active area;
   an electrically insulating spacer structure extending on sidewalls of the bit line and on sidewalls of the direct contact; and
   a semi-insulating field passivation layer extending between the sidewalls of the direct contact and the spacer structure;
   wherein the spacer structure and the field passivation layer comprise different materials; and
   wherein the field passivation layer directly contacts the sidewalls of the direct contact such that a hetero-interface is defined therebetween, said hetero-interface including a quantum well, which extends within the field passivation layer and is configured to enhance a charge density within the direct contact.

2. The device of claim 1, wherein the direct contact comprises polycrystalline silicon; and wherein the field passivation layer is configured to induce electron inversion within the polycrystalline silicon, adjacent the hetero-interface.

3. The device of claim 1, wherein the field passivation layer comprises nonstoichiometric silicon oxide $SiO_x$, where $0.04 \leq x \leq 0.4$.

4. The device of claim 3, wherein the field passivation layer has a thickness of less than about 25 Å.

5. The device of claim 1, wherein the bit line includes a lower conductive pattern, and an upper conductive pattern on the lower conductive pattern; wherein the spacer structure extends on sidewalls of the upper conductive pattern;

and wherein the field passivation layer does not extend between the sidewalls of the upper conductive pattern and the spacer structure.

6. The device of claim 1, wherein the field passivation layer comprises a material having a bandgap energy in a range from about 1.28 eV to about 1.7 eV.

7. The device of claim 6, wherein the field passivation layer has impurities therein, at a concentration in a range from $1\times10^{16}$ cm$^{-3}$ to $1\times10^{21}$ cm$^{-3}$.

8. The device of claim 7, wherein the impurities are selected from a group consisting of phosphorus (P), arsenic (As), bismuth (Bi), and antimony (Sb).

9. The device of claim 8, wherein the field passivation layer contacts the active area.

10. An integrated circuit device comprising:
a substrate including an active area;
a bit line extending on the substrate in a first direction parallel to a top surface of the substrate and including a lower conductive pattern and an upper conductive pattern;
a direct contact disposed between the active area of the substrate and the bit line;
an electrically insulating spacer structure disposed on both sidewalls of the bit line to cover both sidewalls of the direct contact; and
a semi-insulating field passivation layer, which extends between both sidewalls of the direct contact and the spacer structure and forms a hetero-interface with the direct contact, said hetero-interface including a quantum well within the field passivation layer; and
wherein the quantum well within the field passivation layer is configured to induce an electron inversion layer within the direct contact, which increases the conductivity of the direct contact.

11. The integrated circuit device of claim 10, wherein the field passivation layer contacts a whole sidewall of the direct contact.

12. The integrated circuit device of claim 10, wherein the direct contact comprises polysilicon; and wherein the field passivation layer is further configured to provide electric field screening from bulk charge within the spacer structure.

13. The integrated circuit device of claim 10, wherein the field passivation layer comprises silicon oxide (SiO$_x$) (0.04≤x≤0.4).

14. The integrated circuit device of claim 10, wherein the field passivation layer has a first thickness in a second direction which is perpendicular to the first direction and is parallel to the top surface of the substrate, and the first thickness is about 25 Å or less.

15. The integrated circuit device of claim 10, wherein a top surface of the direct contact is coplanar with a top surface of the lower conductive pattern; and wherein the field passivation layer extends along both sidewalls of the lower conductive pattern.

16. The integrated circuit device of claim 15, wherein the field passivation layer covers both sidewalls of the lower conductive pattern; and wherein the lower conductive pattern does not directly contact the spacer structure.

17. The integrated circuit device of claim 10, wherein the field passivation layer is not disposed between the upper conductive pattern and the spacer structure.

18. The integrated circuit device of claim 10, wherein the field passivation layer has bandgap energy of about 1.28 eV to about 1.7 eV.

19. The integrated circuit device of claim 10, wherein the field passivation layer comprises first impurities; and wherein a concentration of the first impurities is within a range from about $1\times10^{16}$ cm$^{-3}$ to about $1\times10^{21}$ cm$^{-3}$.

* * * * *